(12) United States Patent
Hatakeyama et al.

(10) Patent No.: US 10,377,842 B2
(45) Date of Patent: Aug. 13, 2019

(54) POLYMER, NEGATIVE RESIST COMPOSITION, AND PATTERN FORMING PROCESS

(71) Applicant: Shin-Etsu Chemical Co., Ltd., Tokyo (JP)

(72) Inventors: Jun Hatakeyama, Joetsu (JP); Daisuke Domon, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 15/596,374

(22) Filed: May 16, 2017

(65) Prior Publication Data
US 2017/0355795 A1 Dec. 14, 2017

(30) Foreign Application Priority Data

Jun. 8, 2016 (JP) .................................. 2016-114571
Mar. 3, 2017 (JP) .................................. 2017-040213

(51) Int. Cl.
| | | |
|---|---|---|
| G03F 7/038 | (2006.01) | |
| G03F 7/039 | (2006.01) | |
| G03F 7/004 | (2006.01) | |
| G03F 1/76 | (2012.01) | |
| C08F 12/20 | (2006.01) | |
| C08F 12/22 | (2006.01) | |
| C08F 12/24 | (2006.01) | |
| C08F 12/32 | (2006.01) | |
| C08F 212/14 | (2006.01) | |
| C09D 125/18 | (2006.01) | |
| C08F 228/02 | (2006.01) | |

(52) U.S. Cl.
CPC ............ *C08F 212/14* (2013.01); *C08F 12/20* (2013.01); *C08F 12/22* (2013.01); *C08F 12/24* (2013.01); *C08F 12/32* (2013.01); *C09D 125/18* (2013.01); *G03F 1/76* (2013.01); *G03F 7/0045* (2013.01); *G03F 7/0046* (2013.01); *G03F 7/0382* (2013.01)

(58) Field of Classification Search
None
See application file for complete search history.

(56) References Cited

U.S. PATENT DOCUMENTS

| 9,244,348 | B2 | 1/2016 | Masunaga et al. | |
|---|---|---|---|---|
| 9,740,098 | B2* | 8/2017 | Masunaga | G03F 1/20 |
| 2006/0142415 | A1* | 6/2006 | Ylitalo | C09D 11/101 523/160 |
| 2010/0266859 | A1* | 10/2010 | Abe | C09J 133/064 428/522 |
| 2010/0316955 | A1* | 12/2010 | Masunaga | G03F 7/0045 430/285.1 |
| 2012/0219887 | A1* | 8/2012 | Masunaga | G03F 7/0045 430/5 |
| 2012/0219888 | A1* | 8/2012 | Masunaga | G03F 7/0045 430/5 |
| 2013/0209922 | A1* | 8/2013 | Masunaga | G03F 7/0382 430/5 |
| 2014/0212810 | A1* | 7/2014 | Hatakeyama | G03F 7/322 430/285.1 |
| 2015/0017586 | A1* | 1/2015 | Hatakeyama | G03F 7/0397 430/285.1 |
| 2015/0198877 | A1* | 7/2015 | Domon | G03F 7/0045 430/285.1 |
| 2016/0090355 | A1* | 3/2016 | Domon | C07C 381/12 430/5 |
| 2016/0299428 | A1* | 10/2016 | Masunaga | G03F 1/20 |
| 2016/0299431 | A1* | 10/2016 | Adachi | G03F 7/405 |
| 2017/0343898 | A1* | 11/2017 | Hatakeyama | G03F 7/2004 |
| 2018/0039175 | A1* | 2/2018 | Masunaga | G03F 7/0382 |

FOREIGN PATENT DOCUMENTS

| JP | 2004-61794 | A | | 2/2004 | | |
|---|---|---|---|---|---|---|
| JP | 2004-115630 | A | | 4/2004 | | |
| JP | 2006-169302 | A | | 6/2006 | | |
| JP | 2011-237477 | | * | 11/2011 | ............ | G03F 7/038 |
| JP | 2012-108182 | | * | 7/2012 | ............ | G03F 7/039 |
| JP | 2013-164588 | A | | 8/2013 | | |

OTHER PUBLICATIONS

Machine transaltion of JP 2012-108182 (2012).*

* cited by examiner

*Primary Examiner* — Martin J Angebranndt
(74) *Attorney, Agent, or Firm* — Westerman, Hattori, Daniels & Adrian, LLP

(57) ABSTRACT

A polymer comprising recurring units derived from vinylanthraquinone, recurring units containing a benzene ring having a hydroxyl-bearing tertiary alkyl group bonded thereto, and recurring units derived from hydroxystyrene is provided. The polymer is used as a base resin to formulate a negative resist composition having a high resolution and minimal LER.

19 Claims, No Drawings

POLYMER, NEGATIVE RESIST COMPOSITION, AND PATTERN FORMING PROCESS

CROSS-REFERENCE TO RELATED APPLICATION

This non-provisional application claims priority under 35 U.S.C. § 119(a) on Patent Application Nos. 2016-114571 and 2017-040213 filed in Japan on Jun. 8, 2016 and Mar. 3, 2017, respectively, the entire contents of which are hereby incorporated by reference.

FIELD OF INVENTION

This invention relates to a polymer, negative resist composition, and pattern forming process.

BACKGROUND ART

To meet the demand for higher integration density and operating speed of LSIs, the effort to reduce the pattern rule is in rapid progress. At the present, the manufacture of 10 nm node logic devices and the manufacture of DRAM devices of 20 nm or less are approaching to a mass level. They are manufactured by a double patterning version of the ArF lithography. A study is also made on the lithography using EUV of wavelength 13.5 nm.

The flash memory, after pulling the miniaturization technology down to 15 nm, now shifts to a three-dimensional memory intended to increase the capacity by stereoscopic stacking. In this case, a technique for processing a ultra-thick film in excess of 10 nm is needed to process a multi-stage film laminate.

As the number of masks increases in the ArF double patterning lithography, it becomes necessary to improve the accuracy of alignment between plural masks and the accuracy of pattern size. Also for masks used in the EUV lithography, it is necessary to form a pattern of significantly finer size than the feature size in the ArF lithography and of higher accuracy.

The process for the manufacture of mask patterns involves formation of a resist pattern by EB writing. To increase the throughput of EB writing, a chemically amplified resist composition is generally used. The chemically amplified resist composition used herein is typically defined as comprising a polymer in the form of polyhydroxystyrene in which some hydroxyl groups are substituted with acid labile groups as a base resin, an acid generator, a quencher for controlling acid diffusion, a surfactant and an organic solvent. Despite the benefit of high sensitivity, this chemically amplified resist composition has the drawback that resolution and pattern accuracy are reduced by image blur due to acid diffusion.

As the resolution of resist pattern by EB writing improves, the aspect ratio of resist pattern increases, which raises the problem that pattern collapse occurs by the stresses applied during rinsing and drying after development. To prevent such inconvenience, a transition of resist film to a thinner film is proceeding. An improvement in dry etching resistance is necessary as well as the film thickness reduction. For improving the dry etching resistance of a resist film, positive resist compositions based on copolymers of acid labile group-substituted hydroxystyrene with indene and acenaphthylene are proposed in Patent Documents 1 and 2. By copolymerization of indene or acenaphthylene, not only dry etching resistance is improved, but also resolution is improved since acid diffusion is advantageously controlled.

As to the negative resist, negative resist compositions comprising a crosslinker or a base polymer containing crosslinking units are well known, whereas Patent Document 4 discloses a negative resist composition adapted to reduce hydrophilicity by acid-catalyzed dehydration reaction, comprising a polymer comprising recurring units derived from indene or acenaphthylene.

Nowadays, oxide film-bearing hard masks are applied as the mask substrate, eliminating a need for the extreme improvement in dry etching resistance of resist film. A better resolution is required for the resist film rather than the dry etching resistance improvement. Along with the resolution improvement, a reduction of edge roughness (LER, LWR) also becomes important at present.

CITATION LIST

Patent Document 1: JP-A 2004-115630
Patent Document 2: JP-A 2006-169302
Patent Document 3: JP-A 2004-061794
Patent Document 4: JP-A 2013-164588 (U.S. Pat. No. 9,244,348)

DISCLOSURE OF INVENTION

An object of the invention is to provide a polymer which is used as a base resin to formulate a negative resist composition having a high resolution and minimal edge roughness as compared with prior art negative resist compositions; a negative resist composition comprising the polymer, especially adapted for i-line, ArF excimer laser, EB or EUV lithography; and a pattern forming process using the negative resist composition.

Searching for a negative resist composition featuring high resolution and minimal edge roughness, the inventors have found that a polymer comprising specific recurring units is an effective base resin in the negative resist composition.

While polymers comprising recurring units derived from indene or acenaphthylene as described in Patent Document 4 are improved in acid diffusion control and reduced in edge roughness, a further improvement in performance is needed. As a result of copolymerization of indene or acenaphthylene, the backbone of a polymer becomes more robust, the glass transition temperature becomes higher, and accordingly, the acid diffusion distance becomes shorter. Thus these copolymers are more effective in acid diffusion control than styrene copolymers. On the other hand, since indene and acenaphthylene are hydrophobic aromatic compounds, a hydrophilic portion and a hydrophobic portion co-exist in the polymer. The dissolution of the polymer in alkaline developer becomes non-uniform, which incurs swell and causes degradation of edge roughness.

Patent Document 3 describes a copolymer of partially acid labile group-substituted hydroxystyrene and coumarin. This copolymer is less hydrophobic than the indene and acenaphthylene copolymers by the extent of an ester group in coumarin and thus effective for suppressing swell in alkaline developer and reducing edge roughness. However, since coumarin has low polymerization reactivity, it is difficult to uniformly introduce coumarin into a polymer. The attempt does not always lead to the desired reduction of edge roughness.

Making investigations to reduce edge roughness by suppressing acid diffusion for ameliorating alkaline dissolution uniformity, the inventors have found that when a polymer comprising recurring units derived from vinylanthraquinone, recurring units containing a benzene ring having a hydroxyl-bearing tertiary alkyl group bonded thereto, and recurring units derived from hydroxystyrene is used as a base resin to formulate a negative resist composition, there are obtained advantages including a high contrast of alkaline dissolution rate before and after exposure, full suppression of acid diffusion, a high resolution, a good pattern profile and edge roughness after exposure.

Since vinylanthraquinone is as polymerizable as styrene derivatives, it can be uniformly incorporated into a polymer. Since vinylanthraquinone is adequately hydrophilic owing to two carbonyl groups, the polymer has only a little difference between hydrophilicity and hydrophobicity, which contributes to alkaline dissolution uniformity. Two carbonyl groups also serve to control acid diffusion. By virtue of these advantages, a resist pattern featuring high resolution and minimized edge roughness is obtainable.

The negative resist composition of the invention forms a resist film which has many advantages including a high dissolution contrast, full suppression of acid diffusion, high resolution, exposure latitude, process adaptability, and a good pattern profile after exposure. Because of these advantages, the resist composition is fully useful in commercial application and best suited as the fine pattern-forming material for the manufacture of VLSIs and masks.

In one aspect, the invention provides a polymer comprising recurring units having the formula (a), recurring units having the formula (b), and recurring units having the formula (c), the polymer having a weight average molecular weight of 1,000 to 500,000.

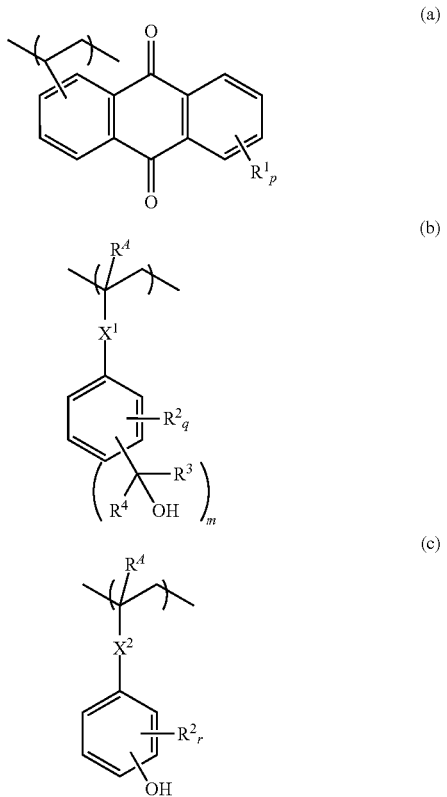

Herein $R^A$ is each independently hydrogen or methyl, $R^1$ is hydroxyl, $C_1$-$C_4$ straight or branched alkyl, $C_1$-$C_4$ straight or branched alkoxy, acetoxy, or halogen, $R^2$ and $R^5$ are each independently $C_1$-$C_4$ straight or branched alkyl or halogen, $R^3$ and $R^4$ are each independently $C_1$-$C_6$ straight, branched or cyclic alkyl, $R^3$ and $R^4$ may bond together to form a ring with the carbon atom to which they are attached, $X^1$ and $X^2$ are each independently a single bond or ester group, m is 1 or 2, p and q each are 0 or 1, and r is an integer of 0 to 4.

The polymer may further comprise recurring units of at least one type selected from recurring units having the formulae (f1) to (f3).

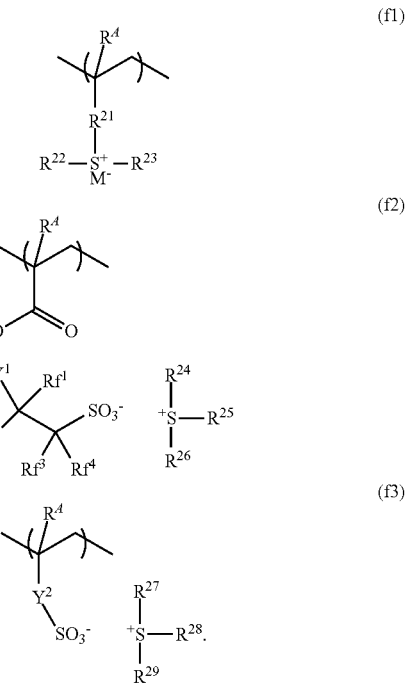

Herein $R^A$ is each independently hydrogen or methyl, $R^{21}$ is a single bond, phenylene group, —O—$R^{31}$—, or —C(=O)—$Z^1$—$R^{31}$—, $Z^1$ is —O— or —NH—, $R^{31}$ is a $C_1$-$C_6$ straight, branched or cyclic alkylene group, $C_2$-$C_6$ straight, branched or cyclic alkenylene group, or phenylene group, which may contain a carbonyl, ester, ether or hydroxyl moiety, $Rf^1$ to $Rf^4$ are each independently fluorine, hydrogen or trifluoromethyl, at least one of $Rf^1$ to $Rf^4$ being fluorine, $R^{22}$ to $R^{29}$ are each independently a $C_1$-$C_{12}$ straight, branched or cyclic alkyl group which may contain a carbonyl, eater or ether moiety, $C_6$-$C_{12}$ aryl group, $C_7$-$C_{20}$ aralkyl group, or mercaptophenyl group, $Y^1$ is a single bond or a $C_1$-$C_{12}$ linking group which may contain an ester, ether moiety or lactone ring. $Y^2$ is a single bond, methylene, ethylene, phenylene, fluorinated phenylene, —O—$R^{32}$—, or —C(=O)—Z—$R^{32}$—, $Z^2$ is —O— or —NH—, $R^{32}$ is a $C_1$-$C_6$ straight, branched or cyclic alkylene group, $C_2$-$C_6$ straight, branched or cyclic alkenylene group, or phenylene group, which may contain a carbonyl, ester, ether or hydroxyl moiety, and $M^-$ is a non-nucleophilic counter ion.

In another aspect, the invention provides a negative resist composition comprising a base resin comprising the polymer defined above. The resist composition may further comprising an organic solvent and an acid generator, the composition being a chemically amplified resist composition. The resist composition may further comprising a basic compound and/or a surfactant.

In a further aspect, the invention provides a pattern forming process comprising the steps of coating the negative resist composition defined above onto a substrate, baking to form a resist film, exposing the resist film to high-energy radiation, and developing the exposed resist film in a developer. Typically, the substrate is a photomask blank. The high-energy radiation is preferably UV having a wavelength of 180 to 400 nm, EB, or EUV having a wavelength of 3 to 15 nm.

A photomask blank coated with the negative resist composition defined above is also provided.

The negative resist composition is used not only in the lithography for forming semiconductor circuits, but also in the formation of mask circuit patterns, micromachines, and thin-film magnetic head circuits.

Advantageous Effects of Invention

The negative resist composition comprising the polymer has advantages including a significantly high contrast of alkaline dissolution rate before and after exposure, a high resolution, a good pattern profile and edge roughness after exposure, and deceleration of acid diffusion rate. Because of these advantages, the resist composition is best suited as a fine pattern-forming material for the manufacture of VLSIs and photomasks and a pattern-forming material for lithography using EB, EUV and ArF excimer laser.

DESCRIPTION OF EMBODIMENTS

The singular forms "a," "an" and "the" include plural referents unless the context clearly dictates otherwise. The notation (Cn-Cm) means a group containing from n to m carbon atoms per group.

The abbreviations have the following meaning.
EB: electron beam
EUV: extreme ultraviolet
PAG: photoacid generator
PEB: post-exposure bake
LER: line edge roughness
LWR: line width roughness
Mw: weight average molecular weight
Mw/Mn: molecular weight distribution or dispersity
GPC: gel permeation chromatography Polymer One embodiment of the invention is a polymer comprising recurring units having the formula (a), recurring units having the formula (b), and recurring units having the formula (c), and having a weight average molecular weight (Mw) of 1,000 to 500,000. Notably, these units are simply referred to as recurring units (a), (b), and (c), respectively.

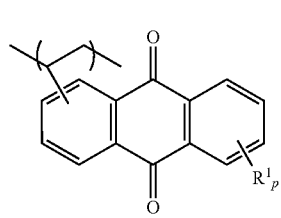
(a)

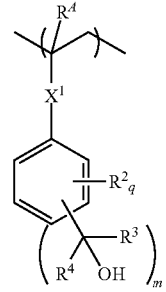
(b)

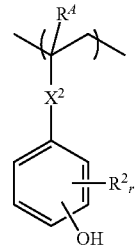
(c)

Herein $R^A$ is each independently hydrogen or methyl. $R^1$ is hydroxyl, a $C_1$-$C_4$ straight or branched alkyl group, $C_1$-$C_4$ straight or branched alkoxy group, acetoxy group, or halogen atom. $R^2$ and $R^5$ are each independently a $C_1$-$C_4$ straight or branched alkyl group or halogen atom. $R^3$ and $R^4$ are each independently a $C_1$-$C_6$ straight, branched or cyclic alkyl group, $R^3$ and $R^4$ may bond together to form a ring with the carbon atom to which they are attached. $X^1$ and $X^2$ are each independently a single bond or ester group, m is 1 or 2, p and q each are 0 or 1, and r is an integer of 0 to 4.

Examples of the monomer from which recurring units (a) are derived are shown below, but not limited thereto.

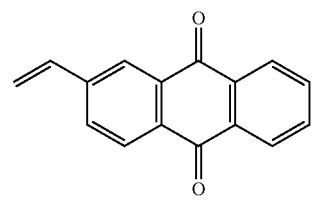

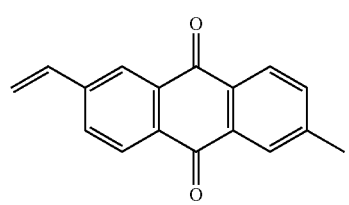

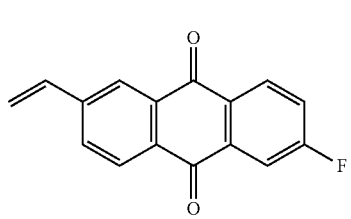

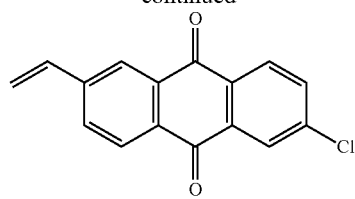
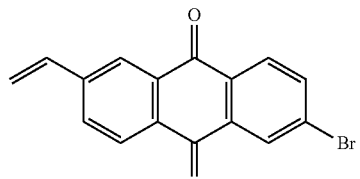
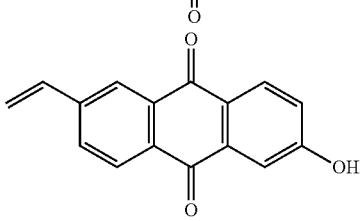
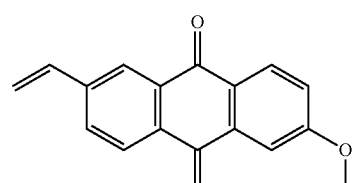
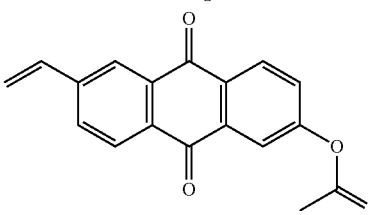
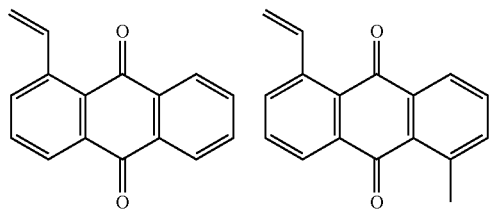
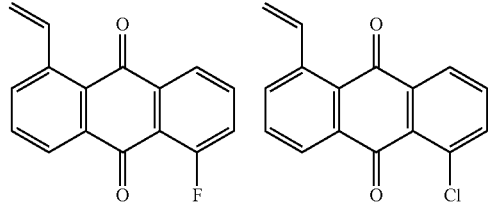
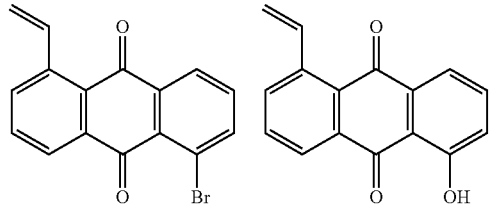
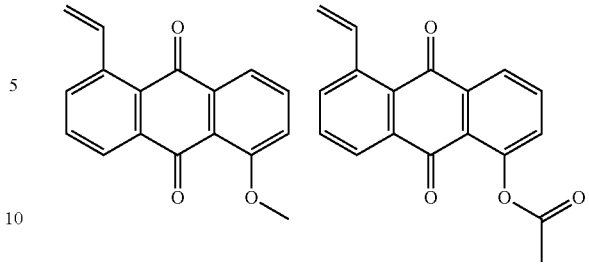
Examples of the monomer from which recurring units (b) are derived are shown below, but not limited thereto. Herein $R^A$ is as defined above.
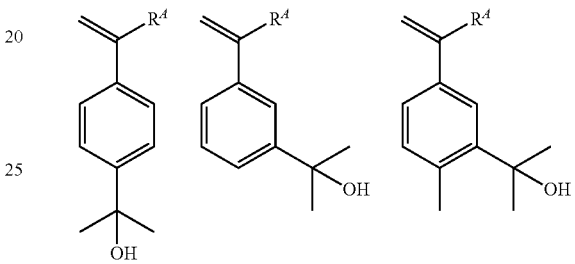
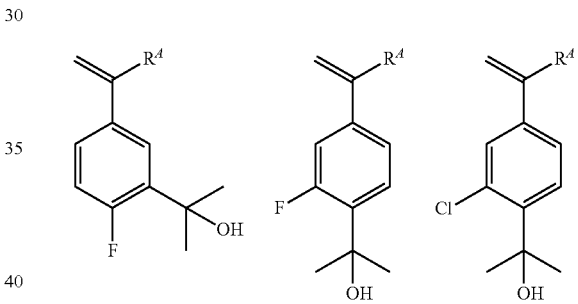
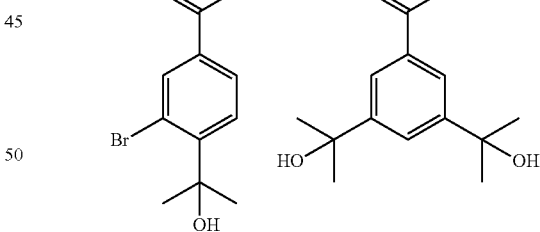
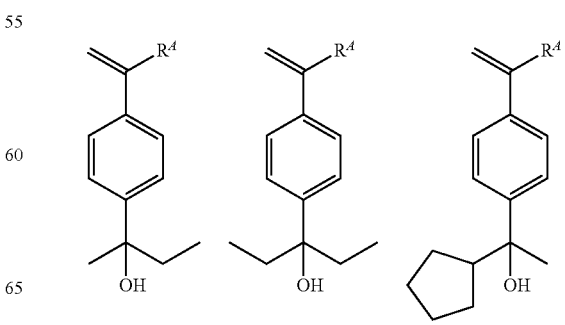

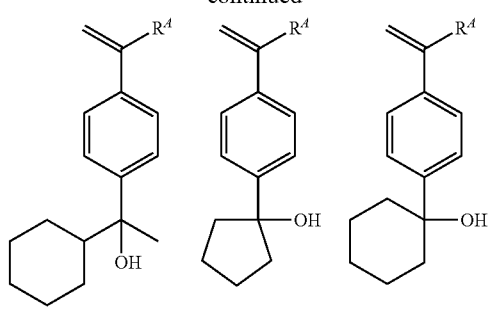
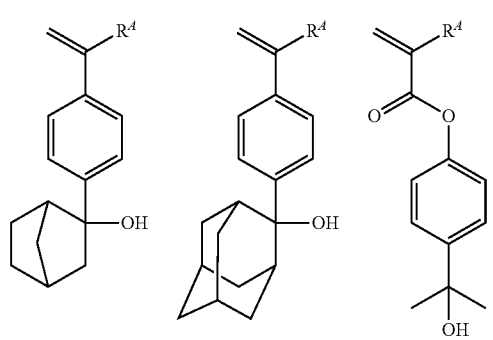
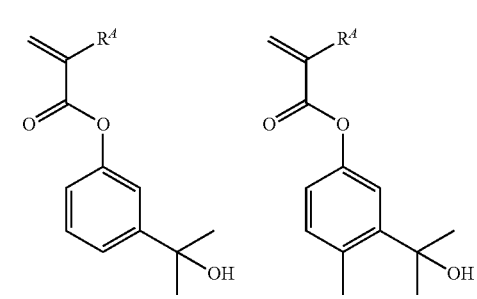
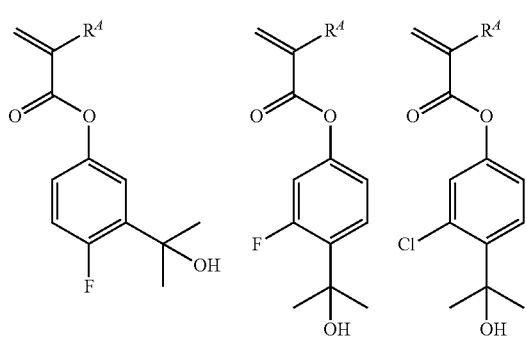
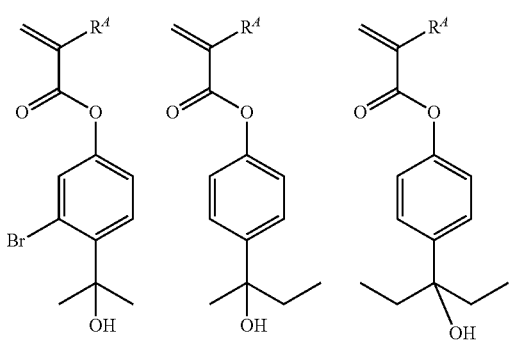
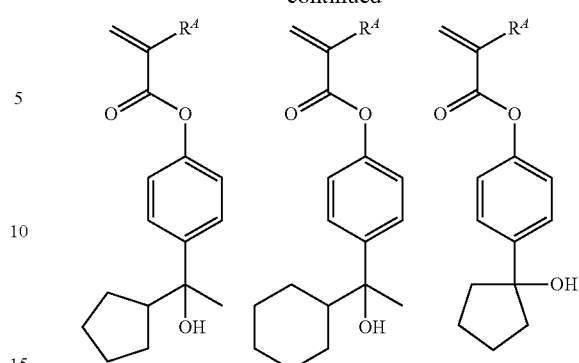
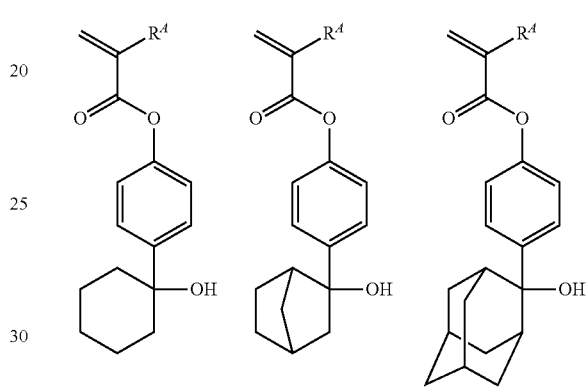
Examples of the monomer from which recurring units (c) are derived are shown below, but not limited thereto. Herein $R^A$ is as defined above.
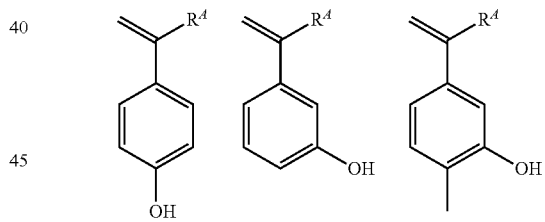
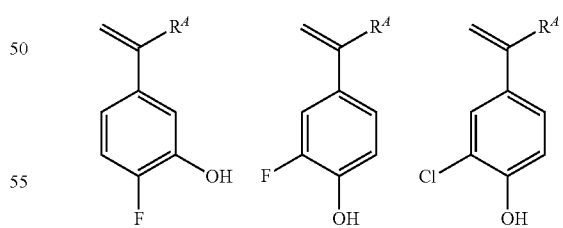
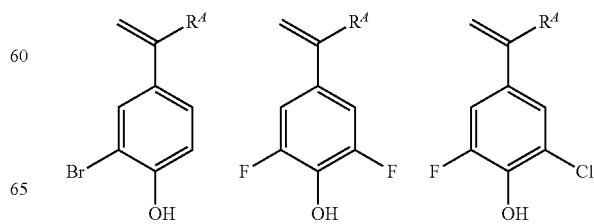

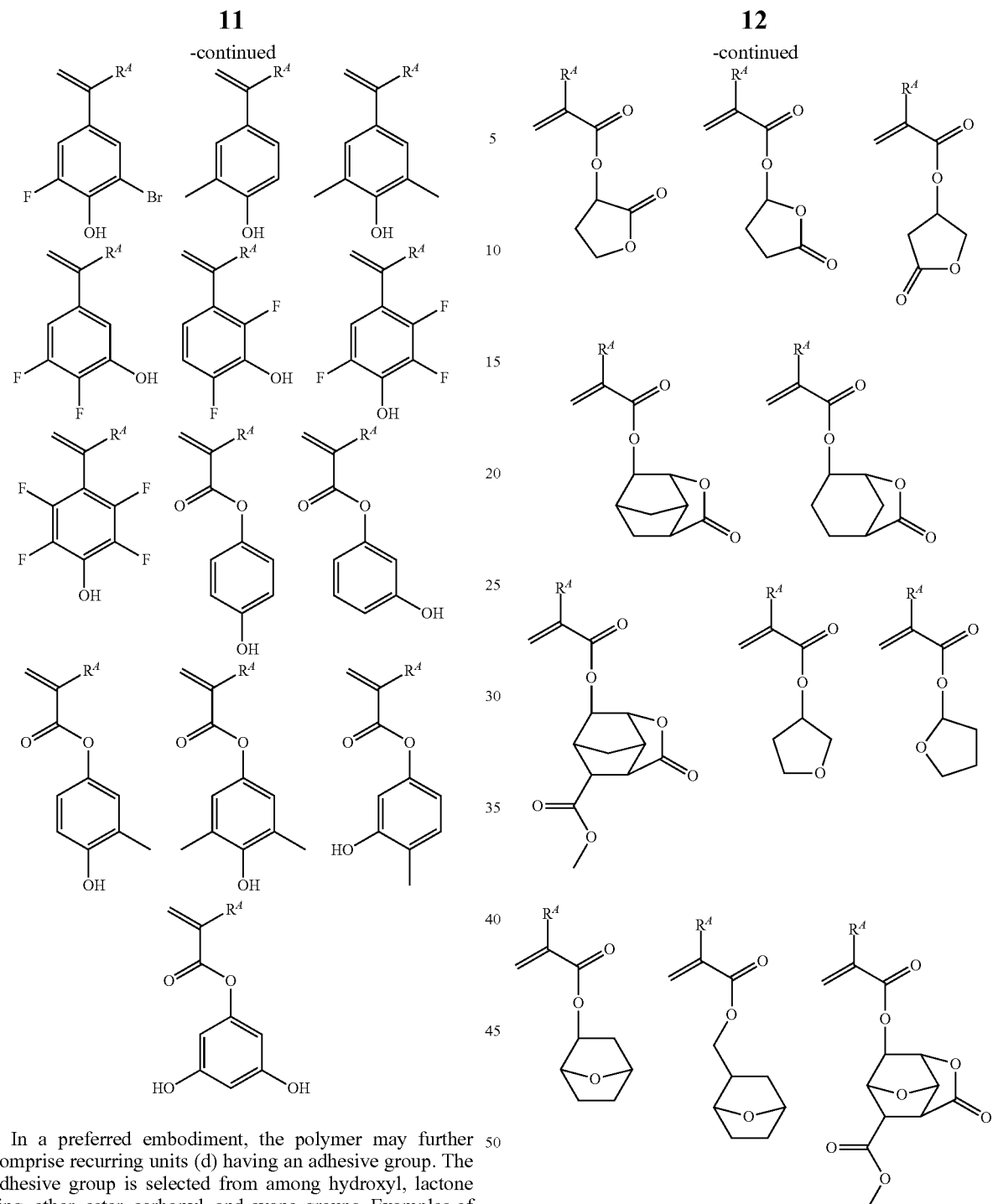
In a preferred embodiment, the polymer may further comprise recurring units (d) having an adhesive group. The adhesive group is selected from among hydroxyl, lactone ring, ether, ester, carbonyl, and cyano groups. Examples of the monomer from which the recurring units (d) are derived are shown below, but not limited thereto. Herein $R^A$ is as defined above.
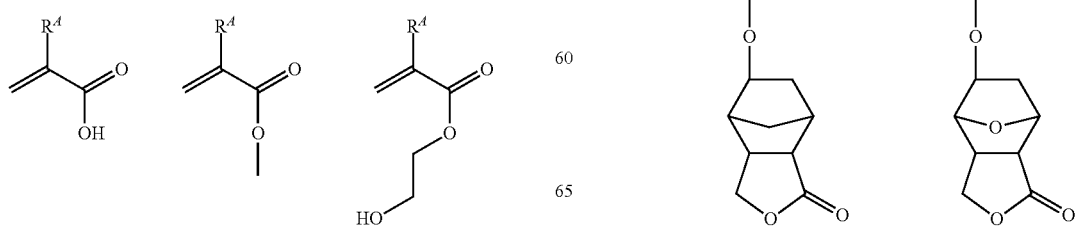

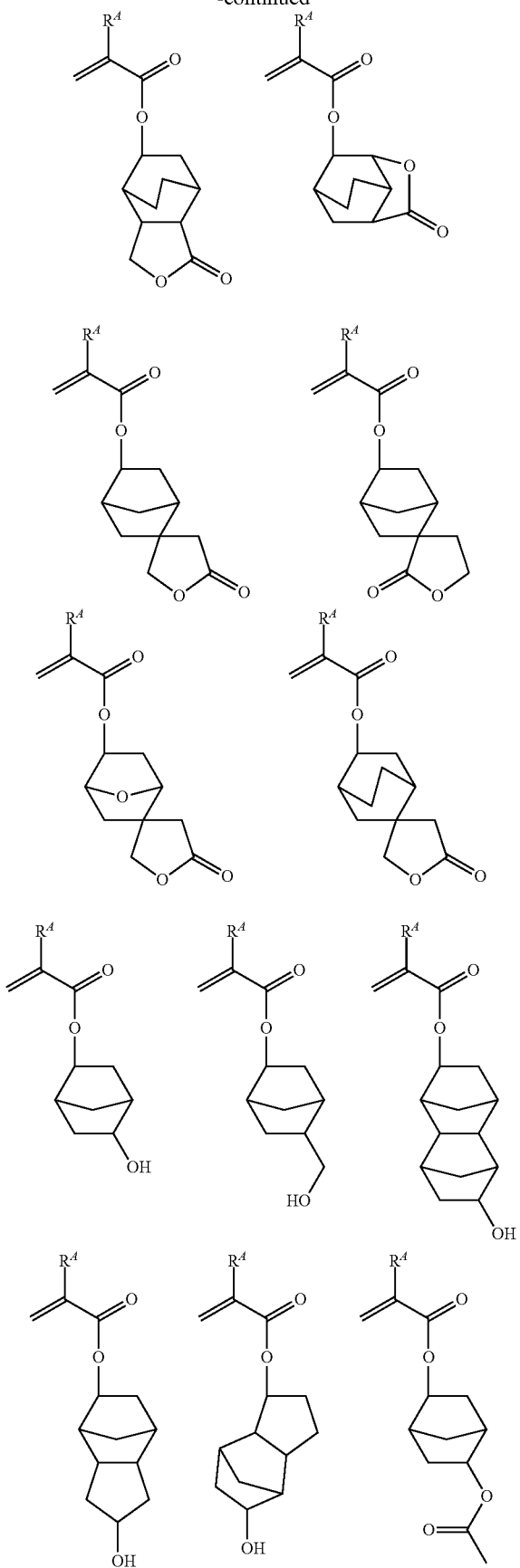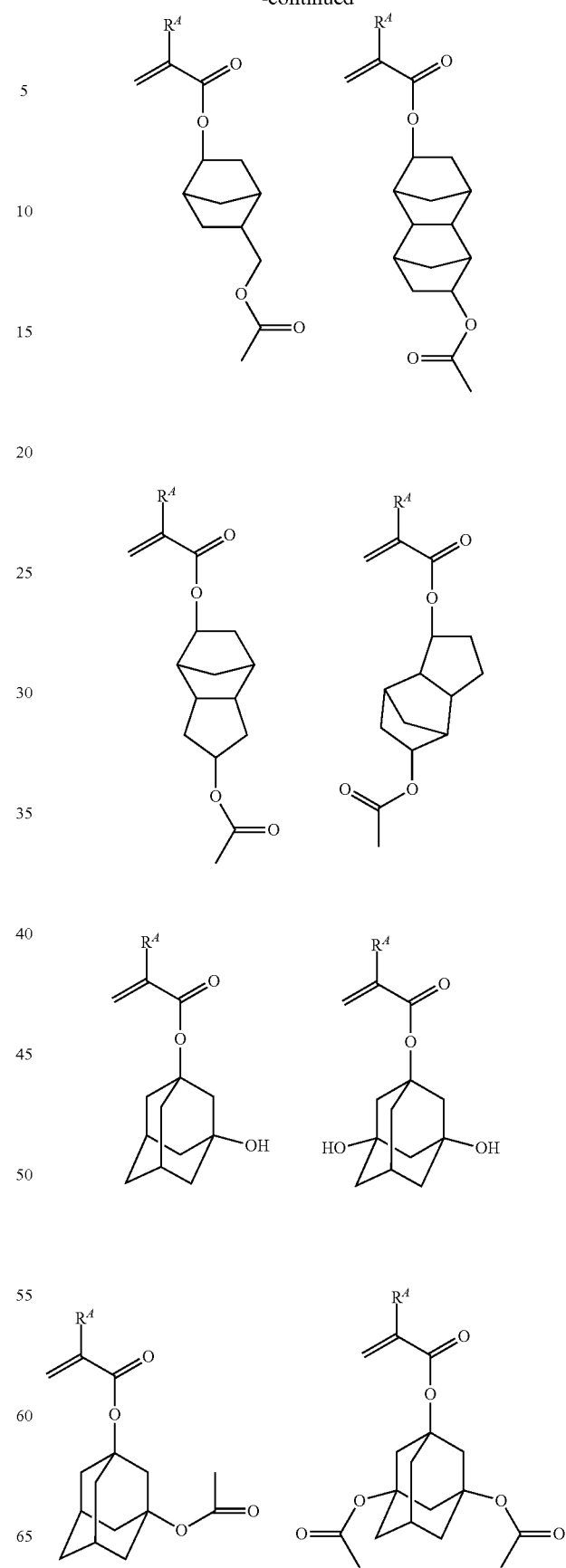

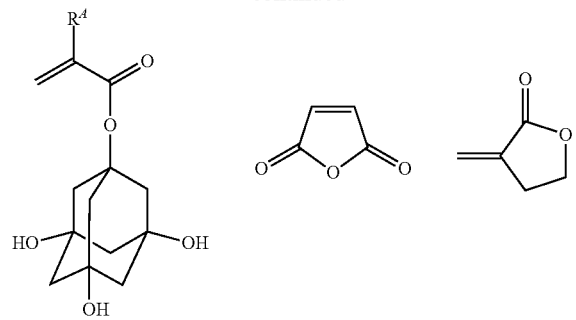
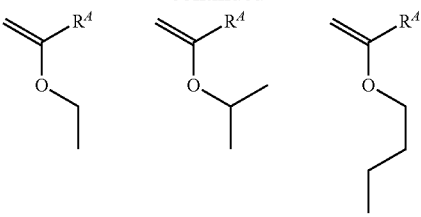
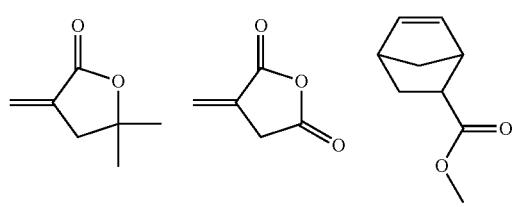
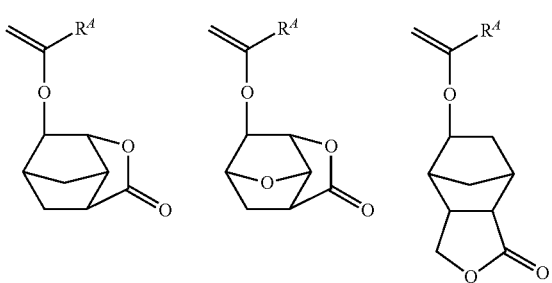
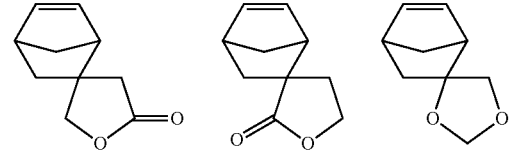
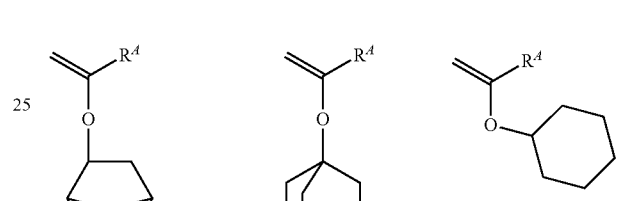
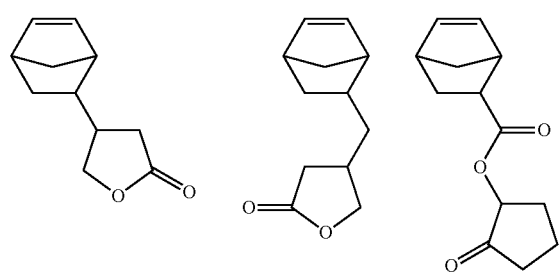
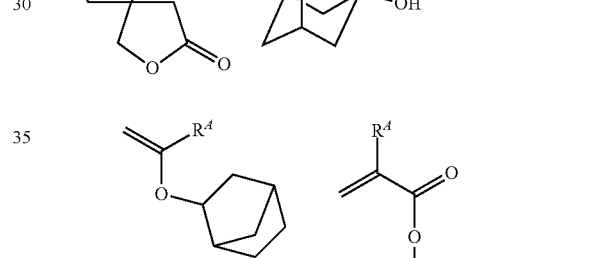
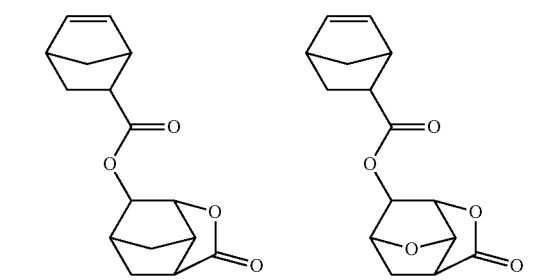
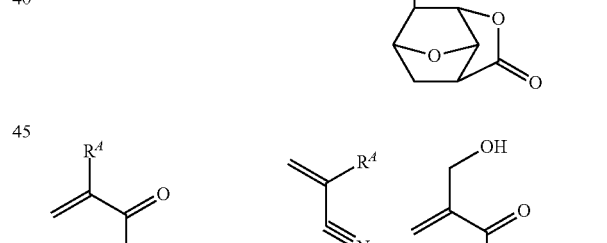
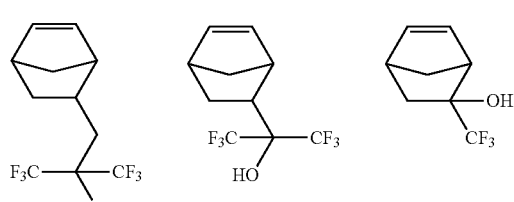
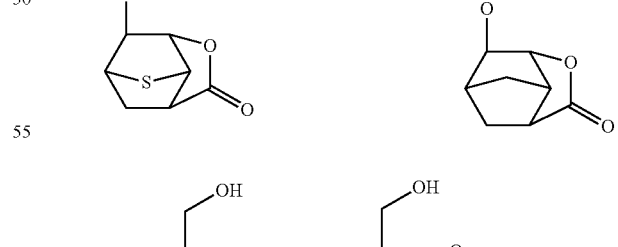
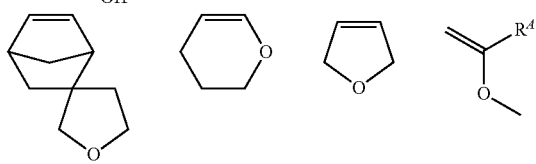
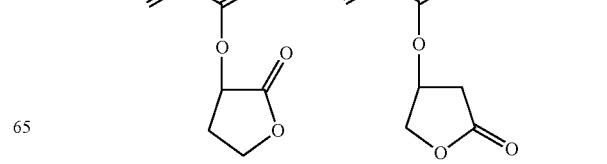

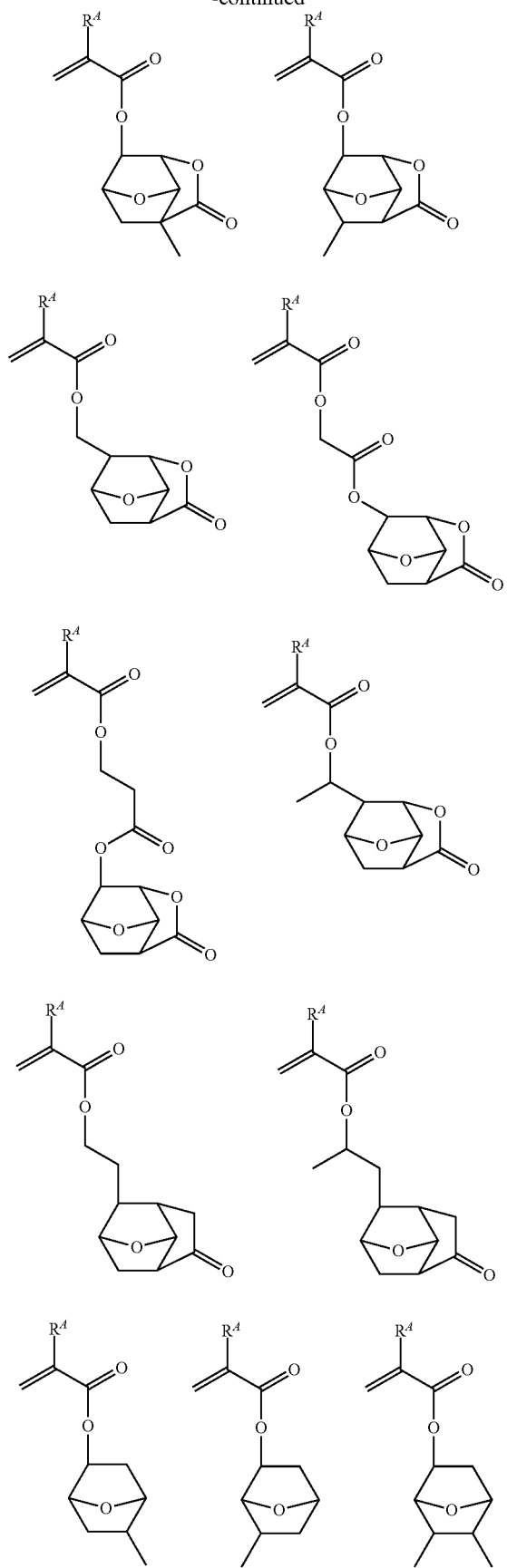
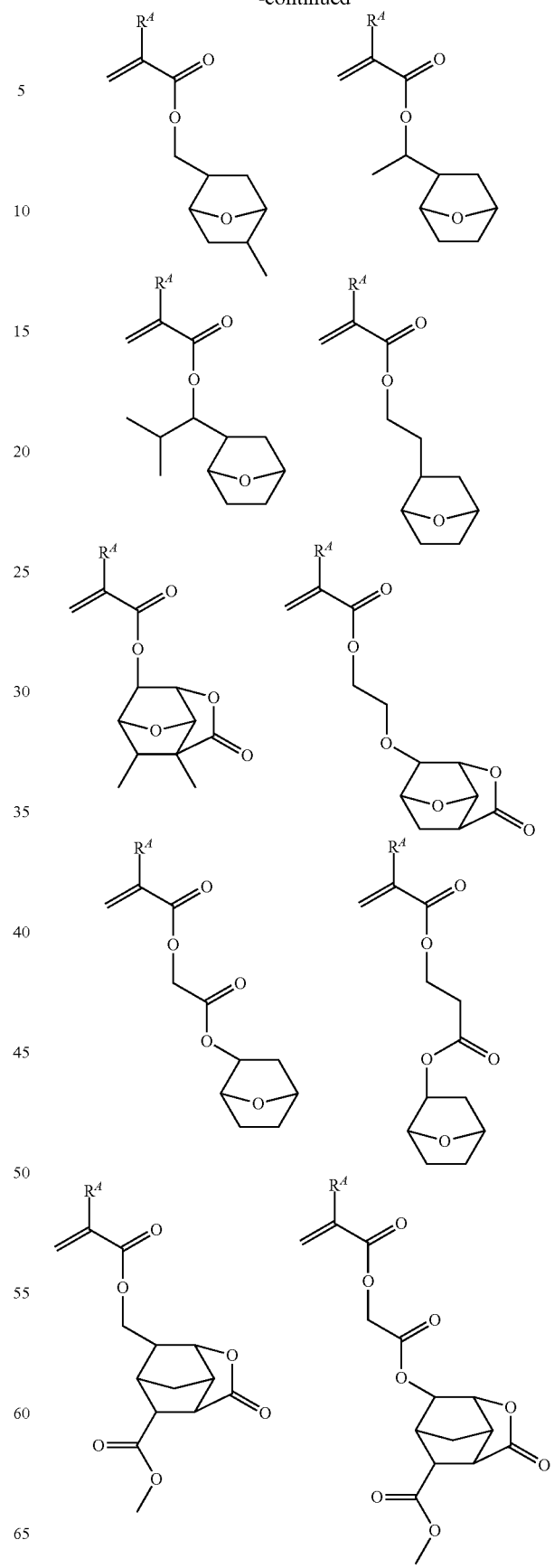

-continued
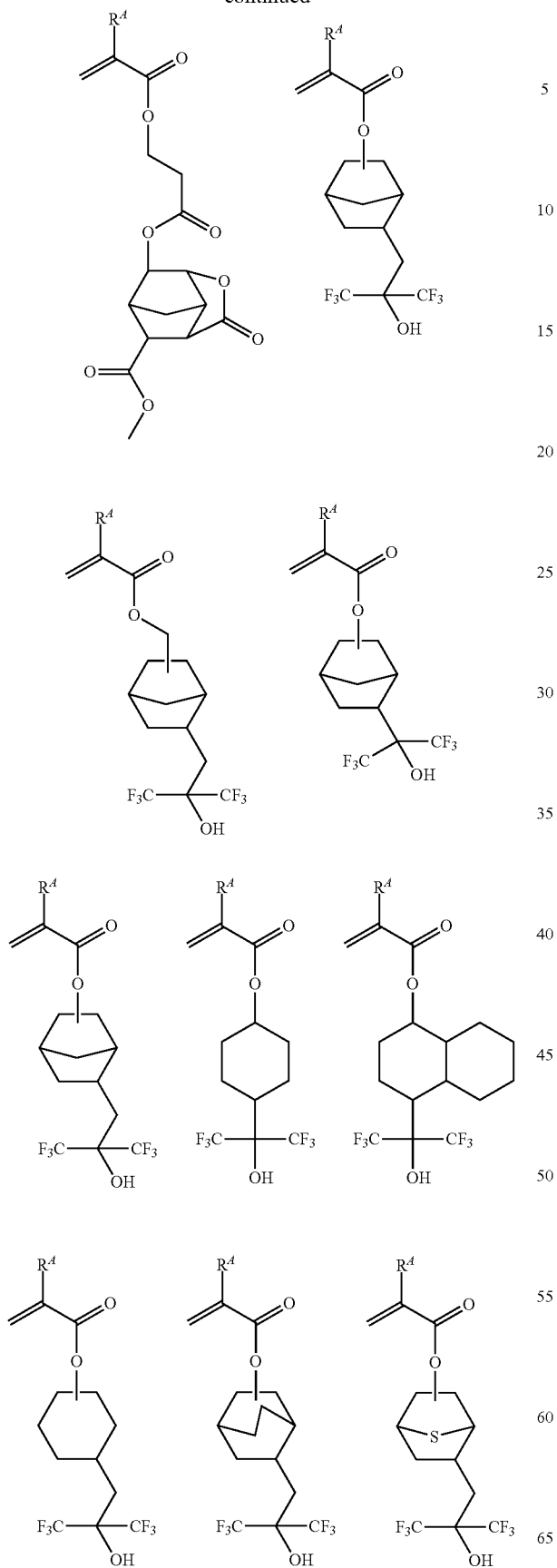
-continued
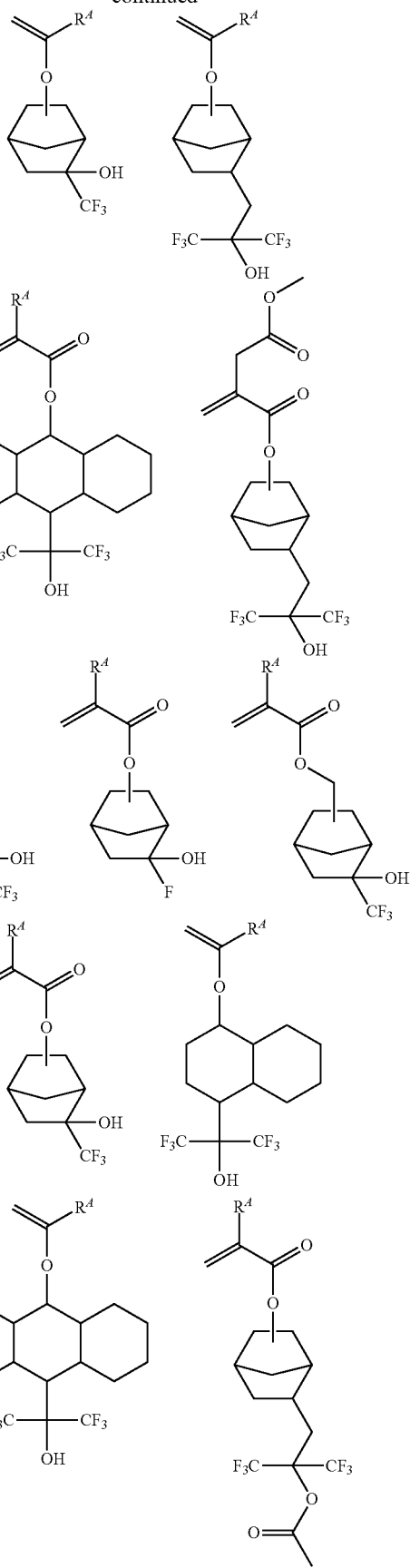

-continued
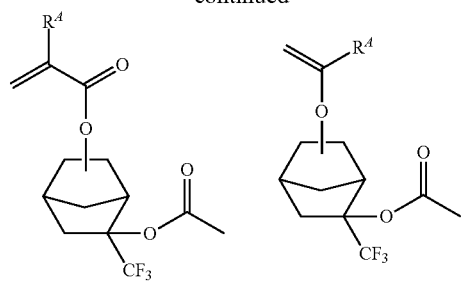
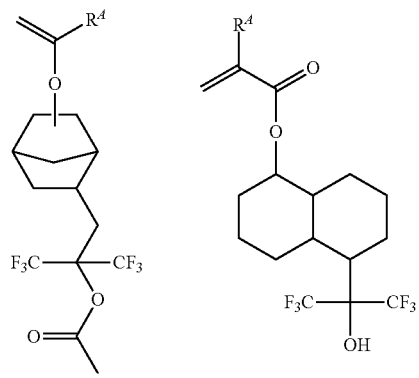
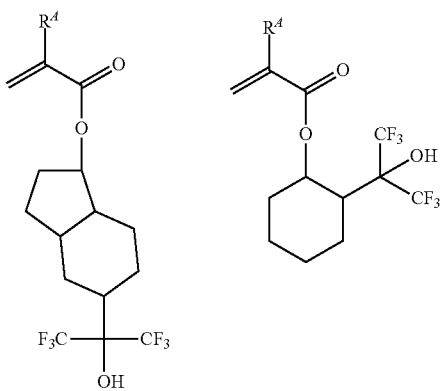
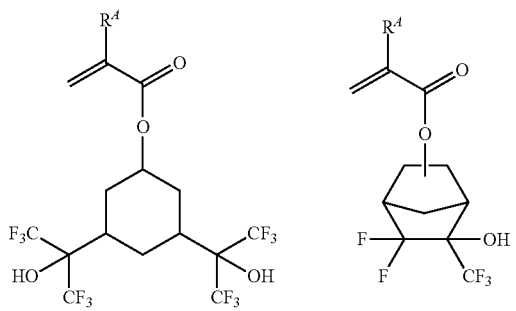
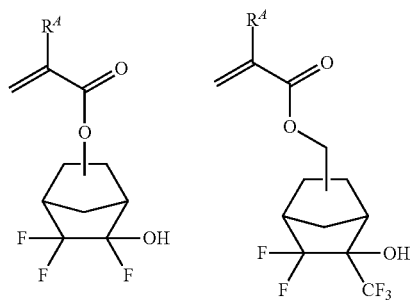
-continued
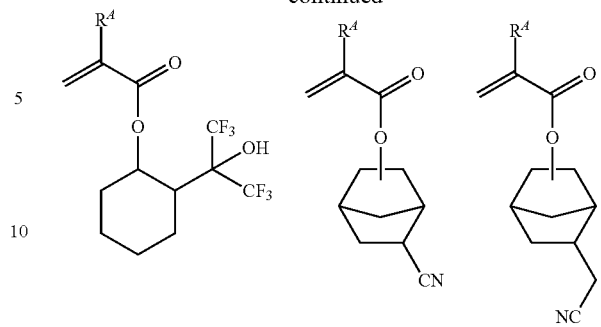
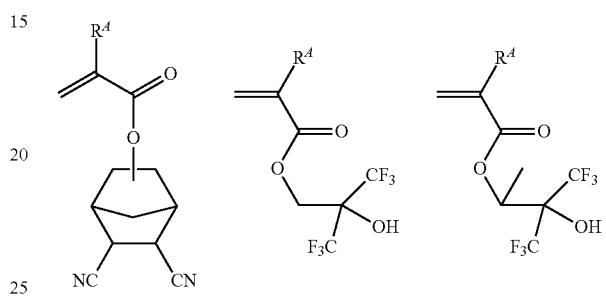
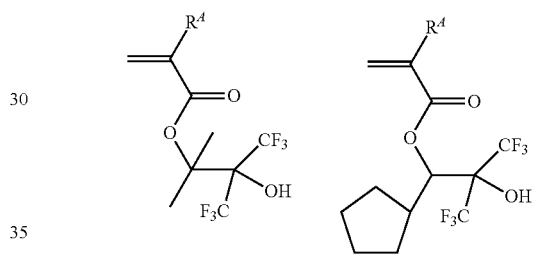
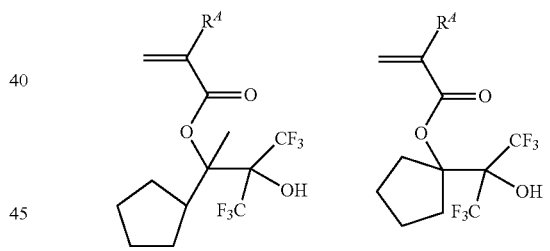
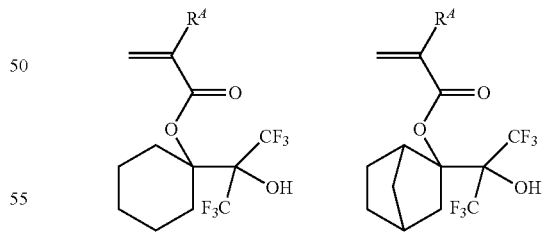
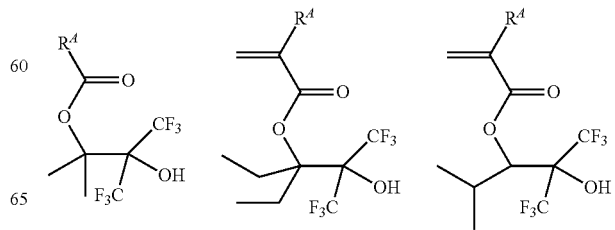

-continued
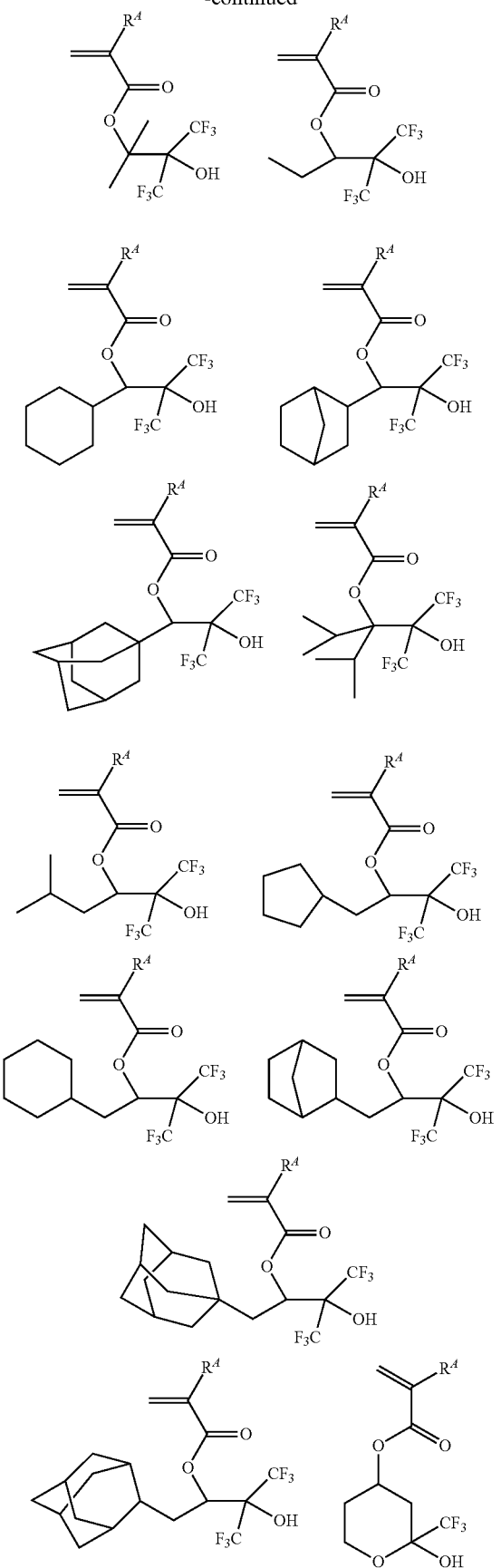
-continued
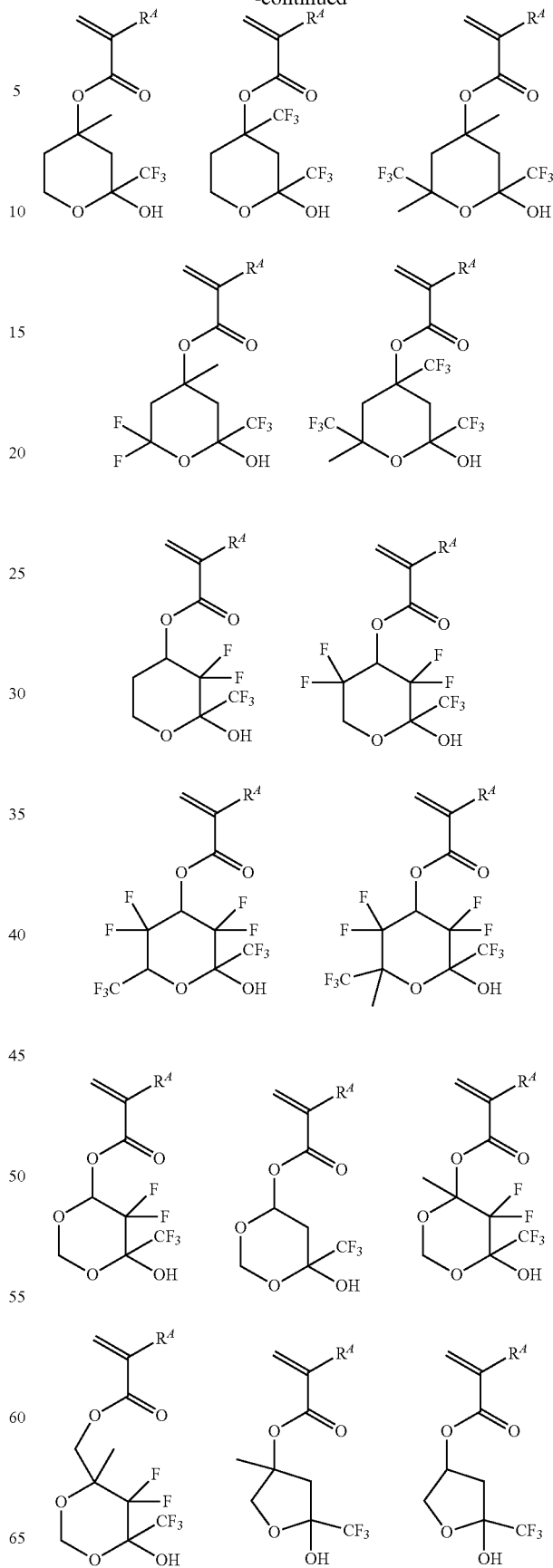

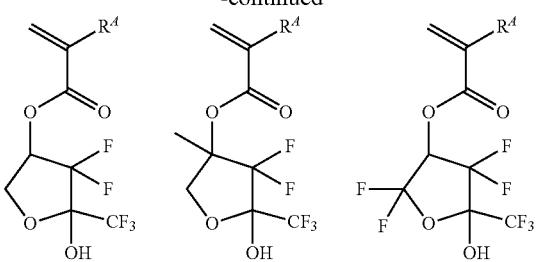
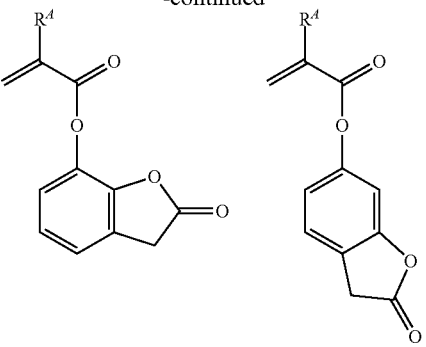
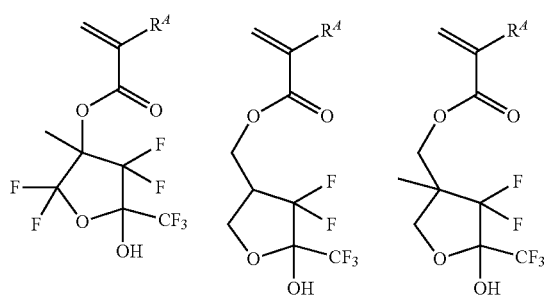
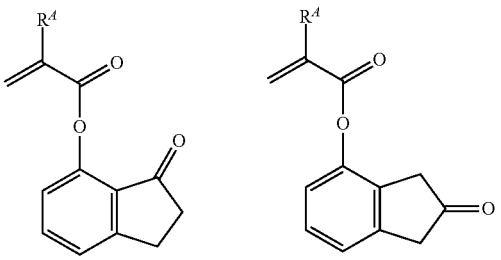
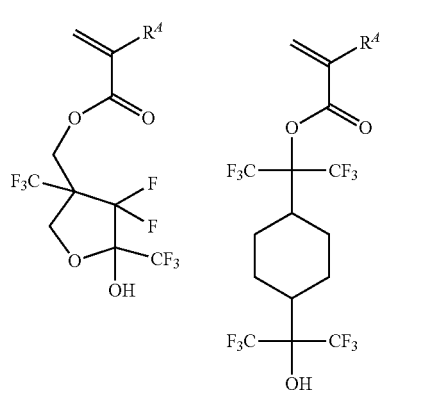
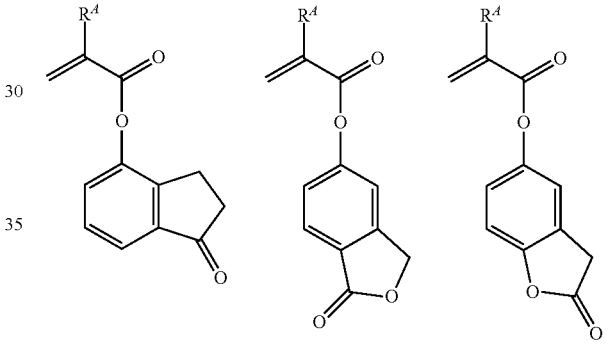
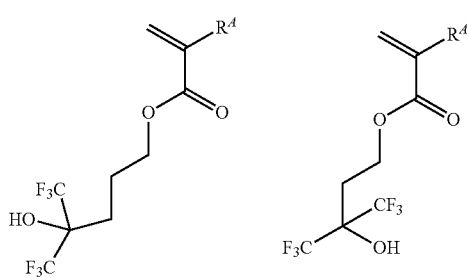
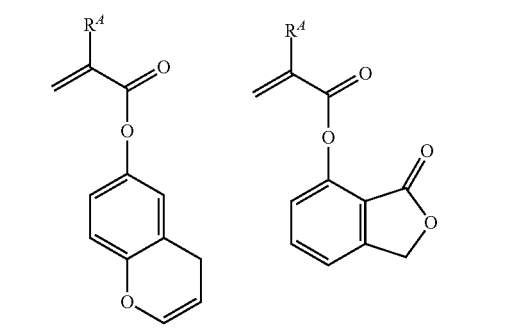
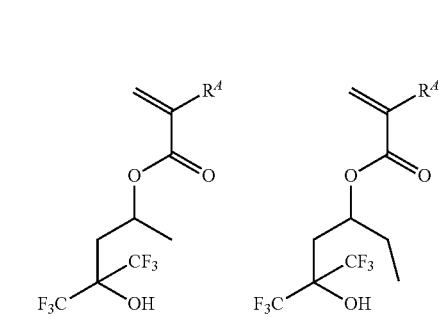
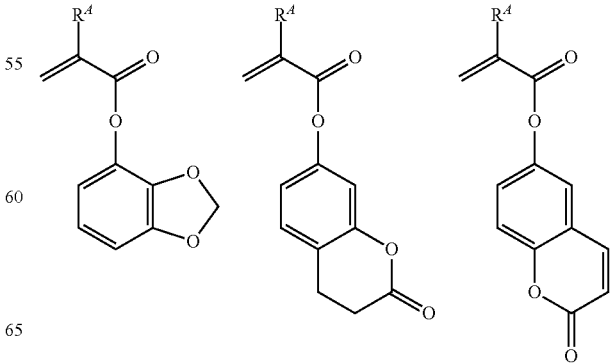

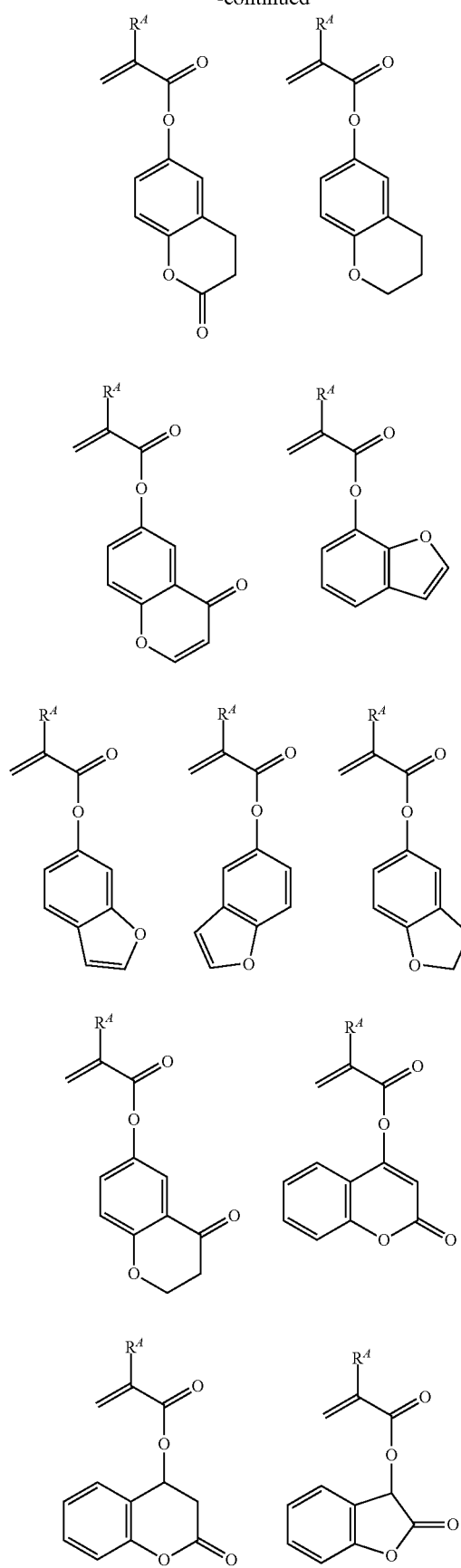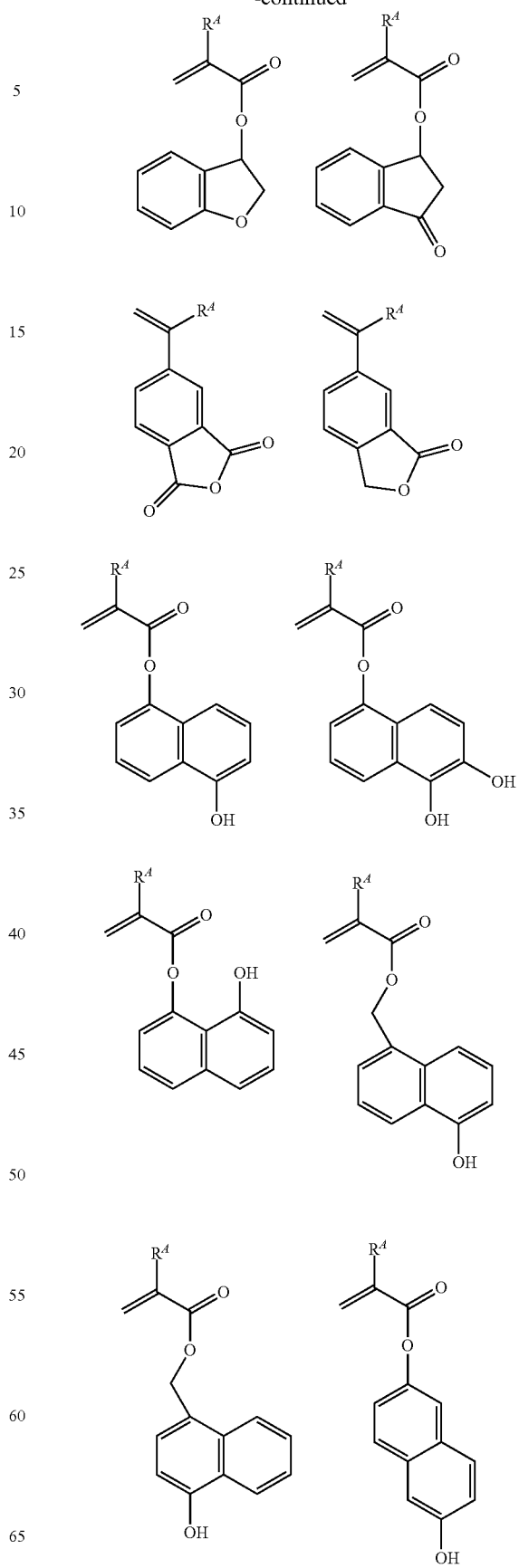

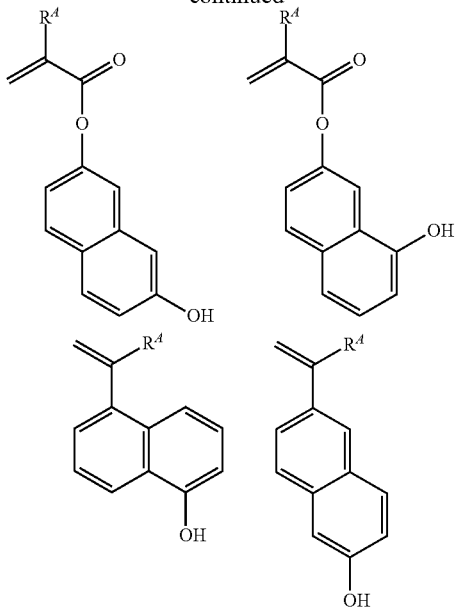

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

In a preferred embodiment, the polymer may further comprise recurring units (f) derived from an onium salt containing polymerizable olefin. JP-A H04-230645, JP-A 2005-084365, and JP-A 2006-045311 describe sulfonium and iodonium salts containing polymerizable olefin, capable of generating specific sulfonic acids. JP-A 2006-178317 describes a sulfonium salt having sulfonic acid directly bonded to the backbone.

The preferred recurring units (f) include recurring units having the formula (f1), recurring units having the formula (f2), and recurring units having the formula (f3). Notably, these units are simply referred to as recurring units (f1), (f2), and (f3), respectively. The recurring units (f1), (f2), and (f3) may be incorporated alone or in admixture of two or more.

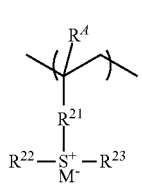

(f1)

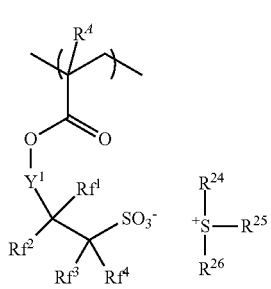

(f2)

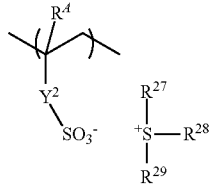

(f3)

Herein $R^A$ is independently hydrogen or methyl. $R^2$ is a single bond, phenylene group, —O—$R^{31}$—, or —C(=O)—$Z^1$—$R^{31}$—, wherein $Z^1$ is —O— or —NH—, $R^{31}$ is a $C_1$-$C_6$ straight, branched or cyclic alkylene group, $C_2$-$C_6$ straight, branched or cyclic alkenylene group, or phenylene group, which may contain a carbonyl, ester, ether or hydroxyl moiety. $Rf^1$ to $Rf^4$ are each independently fluorine, hydrogen or trifluoromethyl, at least one of $Rf^1$ to $Rf^4$ is fluorine. $R^{22}$ to $R^{29}$ are each independently a $C_1$-$C_{12}$ straight, branched or cyclic alkyl group which may contain a carbonyl, ester or ether moiety, $C_6$-$C_{12}$ aryl group, $C_7$-$C_{20}$ aralkyl group, or mercaptophenyl group. $Y^1$ is a single bond or a $C_1$-$C_{12}$ linking group which may contain an ester, ether moiety or lactone ring. $Y^2$ is a single bond, methylene, ethylene, phenylene, fluorinated phenylene, —O—$R^{32}$—, or —C(O)—$Z^2$—$R^{32}$—, wherein $Z^2$ is —O— or —NH—, $R^{32}$ is a $C_1$-$C_6$ straight, branched or cyclic alkylene group, phenylene group, or $C_2$-$C_6$ straight, branched or cyclic alkenylene group, which may contain a carbonyl, ester, ether or hydroxyl moiety. $M^-$ is a non-nucleophilic counter ion.

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perflurobutylsulfonyl)imide; methidates such as tris(trifluoromethylsulfonyl)methide and tris(perfluoroethylsulfonyl)methide.

Other non-nucleophilic counter ions include sulfonates having fluorine substituted at α-position as represented by the formula (K-1) and sulfonates having fluorine substituted at α- and β-positions as represented by the formula (K-2).

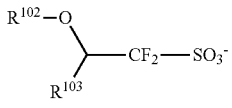

(K-1)

(K-2)

In formula (K-1), $R^{101}$ is hydrogen, or a $C_1$-$C_{30}$ straight, branched or cyclic alkyl group, $C_2$-$C_{30}$ straight, branched or cyclic acyl group, $C_2$-$C_{20}$ straight, branched or cyclic alkenyl group, or $C_6$-$C_{20}$ aryl or aryloxy group, which may contain an ether, ester, carbonyl, lactone ring, lactam ring, sultone ring, amino, sulfone, sulfonic acid ester, carbonate, hydroxyl, thiol, carboxyl, carbamate, amide or imide moiety.

In formula (K-2), $R^{102}$ is hydrogen, or a $C_1$-$C_{30}$ straight, branched or cyclic alkyl group, $C_2$-$C_{30}$ straight, branched or cyclic acyl group, $C_2$-$C_{20}$ straight, branched or cyclic alkenyl group, or $C_6$-$C_{20}$ aryl or aryloxy group, which may contain an ether, ester, carbonyl, lactone ring, lactam ring, sultone ring, amino, sulfone, sulfonic acid ester, carbonate, hydroxyl, thiol, carboxyl, carbamate, amide or imide moiety. $R^{103}$ is hydrogen, methyl, ethyl or trifluoromethyl.

The recurring unit (f) functions as an acid generator. Bonding the acid generator to the polymer backbone makes it possible to suppress acid diffusion and to prevent any drop of resolution by blur due to acid diffusion. Also edge roughness is improved by the uniform distribution of acid generator.

In the polymer, recurring units (a) to (d) and (f) may be incorporated in the following molar fraction: preferably $0<a<1.0$, $0<b<1.0$, $0<c<1.0$, $0 \leq d \leq 0.7$ and $0 \leq f \leq 0.3$; more preferably $0.03 \leq a \leq 0.5$, $0.05 \leq b \leq 0.6$, $0.1 \leq c \leq 0.9$, $0 \leq d \leq 0.6$ and $0 \leq f \leq 0.25$; and even more preferably $0.05 \leq s \leq 0.4$, $0.1 \leq b \leq 0.5$, $0.2 \leq c \leq 0.8$, $0 \leq d \leq 0.5$ and $0 \leq f \leq 0.2$. It is noted that $f=f1+f2+f3$ where recurring unit (f) is at least one of recurring units (f1) to (f3), and that $a+b+c+d+f \leq 1$. The meaning of $a+b+c=1$, for example, is that in a polymer comprising recurring units (a), (b) and (c), the sum of recurring units (a), (b) and (c) is 100 mol % based on the entire recurring units. The meaning of $a+b+c<1$ is that the sum of recurring units (a), (b) and (c) is less than 100 mol % based on the entire recurring units, indicating the inclusion of additional recurring units other than (a), (b) and (c).

The polymer should have a weight average molecular weight (Mw) in the range of 1,000 to 500,000, and preferably 2,000 to 30,000, as measured versus polystyrene standards by GPC using tetrahydrofuran (THF) solvent. With Mw<1,000, the resist composition is less heat resistant. A polymer with Mw>500,000 s less alkali soluble and liable to incur a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and dispersity become stronger as the pattern rule becomes finer. Therefore, the polymer should preferably have a narrow dispersity (Mw/Mn) of 1.0 to 2.0, especially 1.0 to 1.5, in order to provide a resist composition suitable for micropatterning to a small feature size.

The polymer defined herein may be synthesized by any desired methods, for example, by dissolving suitable monomers selected from the monomers corresponding to recurring units (a) to (d) and (f) in an organic solvent, adding a radical polymerization initiator thereto, and effecting heat polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is preferably 2 to 100 hours, more preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for conversion to hydroxystyrene or hydroxyvinylnaphthalene units. For alkaline hydrolysis, a base such as aqueous ammonia or triethylamine may be used. The reaction temperature is preferably −20° C. to 100° C., more preferably 0° C. to 60° C., and the reaction time is preferably 0.2 to 100 hours, more preferably 0.5 to 20 hours.

The polymer defined above is advantageously used as a base resin in a negative resist composition.

Negative Resist Composition

Another embodiment of the invention is a negative resist composition comprising the polymer as a base resin. In this context, not only a single polymer may be used as the base resin, but also a blend of two or more polymers which differ in compositional ratio, molecular weight or dispersity is acceptable.

In the negative resist composition, any desired components including an organic solvent, acid generator, dissolution inhibitor, basic compound, surfactant, and additives may be used in suitable combination. This resist composition has a very high sensitivity in that the dissolution rate in developer of the polymer in exposed areas is decreased by catalytic reaction. In addition, the resist film has a high dissolution contrast, high so resolution, exposure latitude, and process adaptability, and provides a good pattern profile after exposure, yet better etch resistance, and minimal proximity bias because of restrained acid diffusion. By virtue of these advantages, the composition is fully useful in commercial application and suited as a pattern-forming material for the fabrication of VLSIs. Particularly when an acid generator is included to formulate a chemically amplified resist composition capable of utilizing acid catalyzed reaction, the composition has a higher sensitivity and is further improved in the properties described above.

The resist composition may comprise an organic solvent. Examples of the organic solvent are described in U.S. Pat. No. 7,537,880 (JP-A 2008-111103, paragraphs [0144]-[0145]). Specifically, exemplary solvents include ketones such as cyclohexanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether, esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, and mixtures thereof. An appropriate amount of the organic solvent used is 50 to 10,000 parts, more preferably 100 to 5,000 parts by weight per 100 parts by weight of the base resin.

An acid generator may be added to the negative resist composition so that it may function as a chemically amplified negative resist composition. Typical of the acid generator used herein is a photoacid generator (PAG) capable of generating an acid in response to actinic light or radiation. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators, which may be used alone or in admixture. Exemplary PAGs are described in U.S. Pat. No. 7,537,880 (JP-A 2008-111103, paragraphs [0122]-[0142]). An appropriate amount of the acid generator added is 0.01 to 100 parts, more preferably 0.1 to 80 parts by weight per 100 parts by weight of the base resin.

A dissolution regulator may be added to the negative resist composition. The addition of the dissolution regulator to the resist composition is effective for exaggerating a difference in dissolution rate between exposed and unexposed regions, thus contributing to a further improvement in resolution. Exemplary dissolution regulators are described in U.S. Pat. No. 7,771,914 (JP-A 2008-122932, paragraphs [0155]-[0178]). An appropriate amount of the dissolution regulator added is 0 to 50 parts, more preferably 0 to 40 parts by weight per 100 parts by weight of the base resin.

A basic compound may be added to the negative resist composition. The addition of the basic compound to the resist composition is effective, for example, for reducing the rate of acid diffusion in the resist film, thus contributing to a further improvement in resolution. Exemplary basic compounds include primary, secondary and tertiary amine compounds, specifically amine compounds having a hydroxyl, ether, ester, lactone, cyano or sulfonic ester group, as described in JP-A 2008-111103, paragraphs [0146]-[0164] (U.S. Pat. No. 7,537,880) and compounds having a carbamate group as described in JP 3790649. Also useful are quenchers of polymer type as described in JP-A 2008-239918 (U.S. Pat. No. 7,598,016). The polymeric quencher segregates at the resist surface after coating and thus enhances the rectangularity of resist pattern. In the immersion lithography where a protective film is applied on the resist film, the polymeric quencher is also effective for preventing any film thickness loss of resist pattern or rounding of pattern top. An appropriate amount of the basic compound added is 0 to 100 parts, more preferably 0.001 to 50 parts by weight per 100 parts by weight of the base resin.

A surfactant may be added to the negative resist composition. The addition of the surfactant to the resist composition is effective for facilitating or controlling coating operation. Exemplary surfactants are described in JP-A 2008-111103, paragraphs [0165]-[0166]. An appropriate amount of the surfactant added is 0 to 10 parts, more preferably 0.0001 to 5 parts by weight per 100 parts by weight of the base resin.

An acetylene alcohol may be added to the negative resist composition. Exemplary acetylene alcohols are described in JP-A 2008-122932, paragraphs [0179]-[0182]. An appropriate amount of the acetylene alcohol added is 0 to 5 parts by weight per 100 parts by weight of the base resin.

Process

The negative resist composition may be used in the fabrication of various integrated circuits. Pattern formation using the resist composition may be performed by well-known lithography processes. The process generally involves coating, prebake, exposure, and development. If necessary, any additional steps may be added.

The resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$ or $SiO_2$) by a suitable coating technique such as spin coating, roll coating, flow coating, dip coating, spray coating or doctor coating. The coating is prebaked on a hot plate preferably at a temperature of 60 to 150° C. for 10 seconds to 30 minutes, more preferably 80 to 120° C. for 30 seconds to 20 minutes. The resulting resist film is generally 0.01 to 2 μm thick.

The resist film is then exposed to a desired pattern of high-energy radiation such as UV, deep-UV, EUV, EB, x-ray, soft x-ray, excimer laser light, γ-ray or synchrotron radiation directly or through a mask. The exposure dose is preferably about 1 to 200 mJ/cm², more preferably about 10 to 100 mJ/cm², or 0.1 to 100 μC/cm², more preferably 0.5 to 50 μC/cm². The resist film is further baked (PEB) on a hot plate preferably at 60 to 150° C. for 10 seconds to 30 minutes, more preferably at 80 to 120° C. for 30 seconds to 20 minutes. Prior to the exposure stop, an antistatic film based on polythiophene or polyaniline or another topcoat film may be formed on the resist film.

Thereafter the resist film is developed with a developer in the form of an aqueous base solution for 3 seconds to 3 minutes, preferably 5 seconds to 2 minutes by conventional techniques such as dip, puddle or spray techniques. Suitable developers are 0.1 to 10 wt %, preferably 2 to 5 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH). The resist film in the exposed area is not dissolved in the developer whereas the resist film in the unexposed area is dissolved. In this way, the desired negative pattern is formed on the substrate. It is appreciated that the resist composition of the invention is best suited for micro-patterning using such high-energy radiation as BB, EUV, x-ray, soft x-ray, γ-ray and synchrotron radiation among others.

Although TMAH aqueous solution is generally used as the developer, TEAH, TPAH and TBAH having a longer alkyl chain are effective in inhibiting the resist film from being swollen during development and thus preventing pattern collapse. The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent such as TEAH, TPAH or TBAH is effective for preventing film swell and hence, pattern collapse.

EXAMPLE

Examples and Comparative Examples are given below for further illustrating the invention, but they should not be construed as limiting the invention thereto. All parts (pbw) are by weight. Mw and Mn are as measured versus polystyrene standards by GPC using THF solvent. Monomers 1 to 3 and PAG Monomers 1 to 4 are identified below.

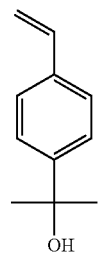

Monomer 1

Monomer 2

Monomer 3

PAG Monomer 1

PAG Monomer 2

PAG Monomer 3

PAG Monomer 4

1) Synthesis of Polymers

Example 1-1: Synthesis of Polymer 1

A 2-L flask was charged with 3.5 g of 2-vinylanthraquinone, 4.1 g of Monomer 1, 7.2 g of 4-hydroxystyrene, and 20 g of THF solvent. The reactor was cooled at −70° C. in nitrogen atmosphere, after which vacuum pumping and nitrogen blow were repeated three times. The reactor was warmed up to room temperature, whereupon 1.2 g of azobisisobutyronitrile (AIBN) as polymerization initiator was added. The reactor was heated at 60° C., whereupon reaction ran for 15 hours. The reaction solution was concentrated to ½ in volume and poured into a mixture of 1 L of methanol and 0.1 L of water whereupon white solids precipitated. The precipitate was filtered and dried in vacuum at 60° C., yielding Polymer 1. Polymer 1 was analyzed for composition by $^{13}$C- and $^{1}$H-NMR and for Mw and Mw/Mn by GPC.

Polymer 1

Mw = 5,200
Mw/Mn = 1.55

Example 1-2: Synthesis of Polymer 2

A 2-L flask was charged with 3.5 g of 2-vinylanthraquinone, 4.1 g of Monomer 2, 7.8 g of 4-hydroxystyrene, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was concentrated to ½ in volume and poured into a mixture of 1 L of methanol and 0.1 L of water whereupon white solids precipitated. The precipitate was filtered and dried in vacuum at 60° C., yielding Polymer 2. Polymer 2 was analyzed for composition by $^{13}$C- and $^1$H-NMR and for Mw and Mw/Mn by GPC.

was concentrated to ½ in volume and poured into a mixture of 1 L of methanol and 0.1 L of water whereupon white solids precipitated. The precipitate was filtered and dried in vacuum at 60° C., yielding Polymer 3. Polymer 3 was analyzed for composition by $^{13}$C- and $^1$H-NMR and for Mw and Mw/Mn by GPC.

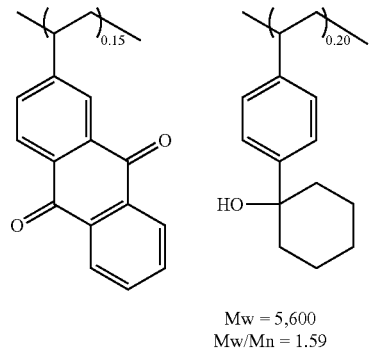

Polymer 2

Mw = 5,600
Mw/Mn = 1.59

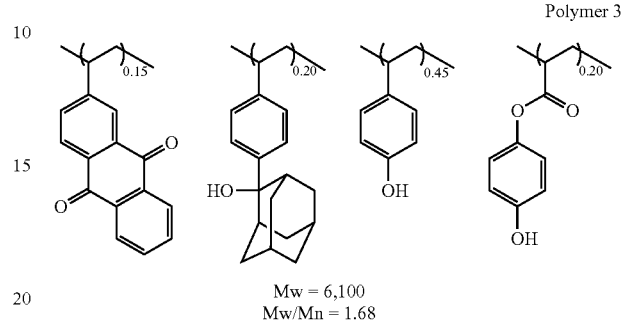

Polymer 3

Mw = 6,100
Mw/Mn = 1.68

Example 1-3: Synthesis of Polymer 3

A 2-L flask was charged with 3.5 g of 2-vinylanthraquinone, 5.1 g of Monomer 3, 4.2 g of 4-hydroxystyrene, 3.6 g of 4-hydroxyphenyl methacrylate, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution

Example 1-4: Synthesis of Polymer 4

A 2-L flask was charged with 3.5 g of 2-vinylanthraquinone, 4.9 g of Monomer 1, 4.8 g of 4-hydroxystyrene, 6.8 g of PAG Monomer 1, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was concentrated to ½ in volume and poured into a mixture of 1 L of methanol and 0.1 L of water whereupon white solids precipitated. The precipitate was filtered and dried in vacuum at 60° C., yielding Polymer 4. Polymer 4 was analyzed for composition by $^{13}$C- and $^1$H-NMR and for Mw and Mw/Mn by GPC.

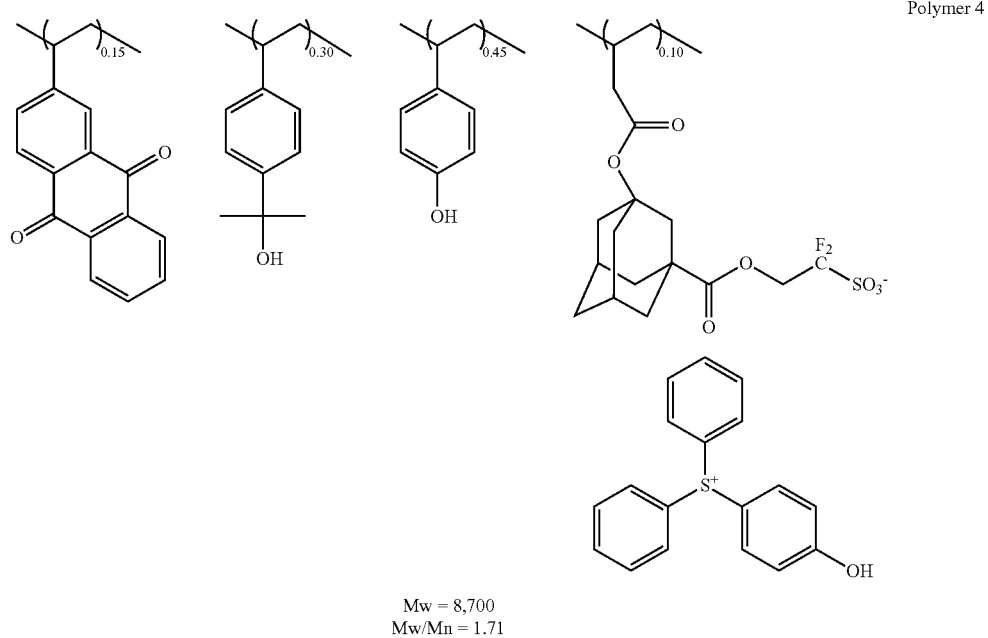

Polymer 4

Mw = 8,700
Mw/Mn = 1.71

Example 1-5: Synthesis of Polymer 5

A 2-L flask was charged with 4.5 g of 2-vinylanthraquinone, 4.9 g of Monomer 1, 4.8 g of 4-hydroxystyrene, 5.9 g of PAG Monomer 2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was concentrated to ½ in volume and poured into a mixture of 1 L of methanol and 0.1 L of water whereupon white solids precipitated. The precipitate was filtered and dried in vacuum at 60° C., yielding Polymer 5. Polymer 5 was analyzed for composition by $^{13}$C- and $^1$H-NMR and for Mw and Mw/Mn by GPC.

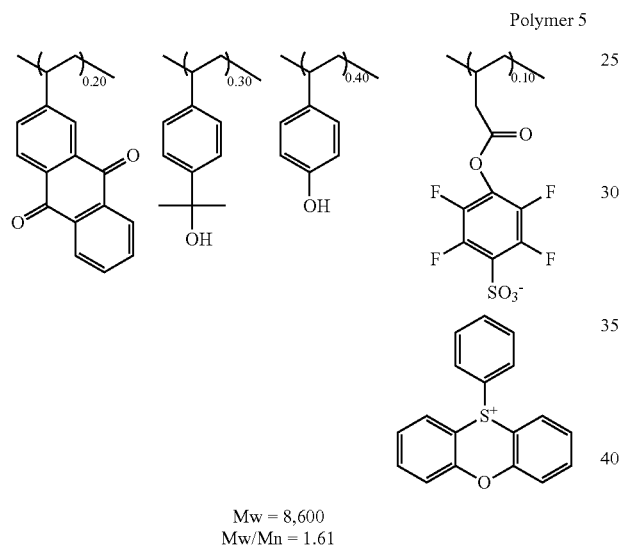

Mw = 8,600
Mw/Mn = 1.61

Example 1-6: Synthesis of Polymer 6

A 2-L flask was charged with 4.5 g of 2-vinylanthraquinone, 4.9 g of Monomer 1, 5.3 g of 4-hydroxyphenyl methacrylate, 2.2 g of 3-oxo-2,7-dioxatricyclo[4.2.1.0$^{4,8}$] nonan-9-yl methacrylate, 7.4 g of PAG Monomer 3, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was concentrated to ½ in volume and poured into a mixture of 1 L of methanol and 0.1 L of water whereupon white solids precipitated. The precipitate was filtered and dried in vacuum at 60° C., yielding Polymer 6. Polymer 6 was analyzed for composition by $^{13}$C- and $^1$H-NMR and for Mw and Mw/Ma by GPC.

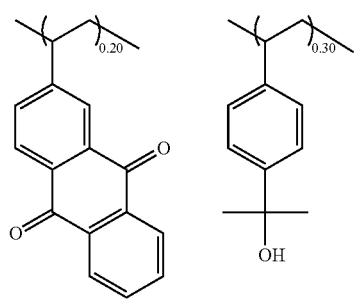
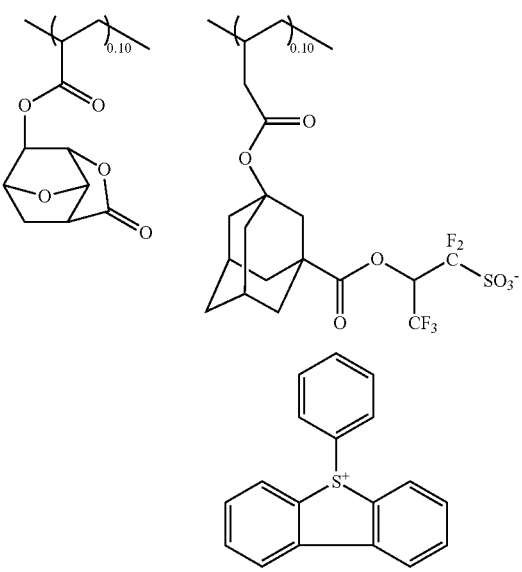

Polymer 6

Mw = 8,200
Mw/Mn = 1.69

Example 1-7: Synthesis of Polymer 7

A 2-L flask was charged with 2.3 g of 2-vinylanthraquinone, 4.9 g of Monomer 1, 5.3 g of 4-hydroxyphenyl methacrylate, 2.0 g of α-methylene-γ-butyrolactone, 7.4 g of PAG Monomer 4, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was concentrated to ½ in volume and poured into a mixture of 1 L of methanol and 0.1 L of water whereupon white solids precipitated. The precipitate was filtered and dried in vacuum at 60° C., yielding Polymer 7. Polymer 7 was analyzed for composition by $^{13}C$- and $^{1}H$-NMR and for Mw and Mw/Mn by GPC.

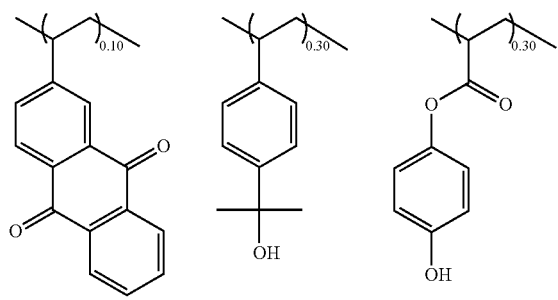
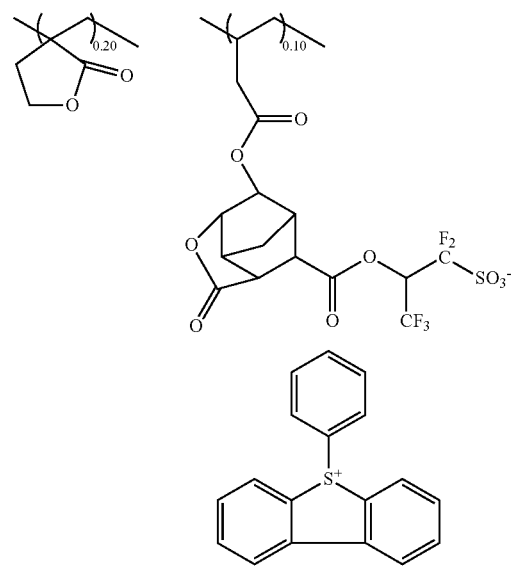

Polymer 7

Mw = 8,600
Mw/Mn = 1.66

Comparative Example 1-1: Synthesis of Comparative Polymer 1

Comparative Polymer 1 was synthesized by the same procedure as in Example 1-1 aside from using 2.3 g of acenaphthylene instead of 2-vinylanthraquinone. Comparative Polymer 1 was analyzed for composition by $^{13}$C- and $^1$H-NMR and for Mw and Mw/Mn by GPC.

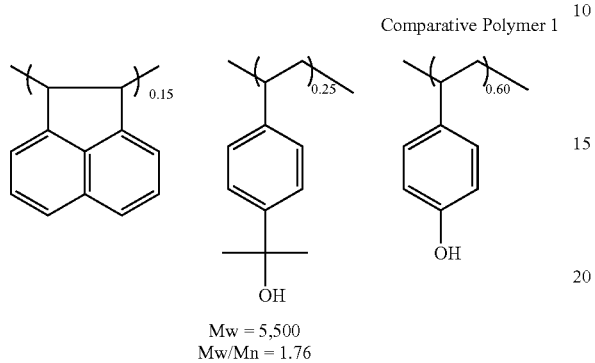

Comparative Polymer 1

Mw = 5,500
Mw/Mn = 1.76

2) Preparation of Negative Resist Composition

Examples 2-1 to 2-9 and Comparative Example 2-1

Negative resist compositions were prepared by dissolving components in a solvent in accordance with the recipe shown in Table 1, and filtering through a filter having a pore size of 0.2 μm. The solvent contained 100 ppm of surfactant FC-4430 (3M). The components in Table 1 are as identified below.

Polymers 1 to 7: Polymers obtained in Examples 1-1 to 1-7
Comparative Polymer 1: Polymer obtained in Comparative Example 1
Organic solvents: PGMEA (propylene glycol monomethyl ether acetate) CyH (cyclohexanone)
Acid generator: PAG1 of the following structural formula
Basic compound: Quencher 1 of the following structural formula

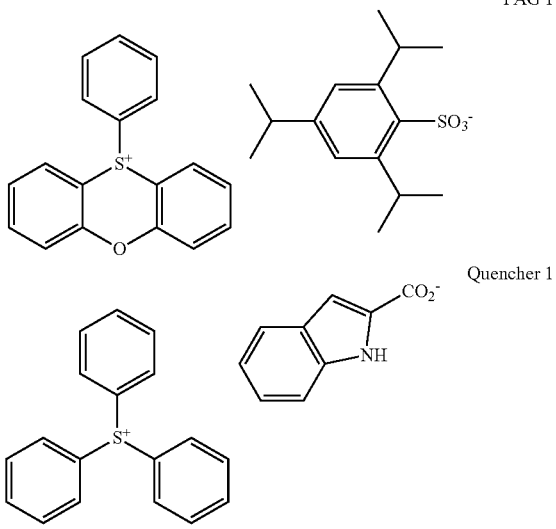

PAG 1

Quencher 1

3) EB Lithography Patterning Test

Using a coater/developer system Clean Track Mark 5 (Tokyo Electron Ltd.), each of the negative resist compositions of Examples 2-1 to 2-9 and Comparative Example 2-1 was spin coated onto a silicon substrate of diameter 6 inches and prebaked on a hot plate at 110° C. for 60 seconds to form a resist film of 100 nm thick. Using a system HL-800D (Hitachi Ltd.) at a HV voltage of 50 kV, the resist film was exposed imagewise to EB in a vacuum chamber.

Using Clean Track Mark 5, immediately after the exposure, the resist film was baked (PEB) on a hot plate at the temperature shown in Table 1 for 60 seconds and puddle developed in a 2.38 wt % TMAH aqueous solution for 30 seconds to form a negative pattern.

Resolution is a minimum size at the exposure dose (sensitivity) that provides a 1:1 resolution of a 100-nm line-and-space pattern. The 100-nm L/S pattern was measured for roughness (LER) under SEM. The results are shown in Table 1.

TABLE 1

| | Polymer (pbw) | Acid generator (pbw) | Basic compound (pbw) | Organic solvent (pbw) | PEB temp. (° C.) | Sensitivity (μC/cm$^2$) | Resolution (nm) | LER (nm) |
|---|---|---|---|---|---|---|---|---|
| Example 2-1 | Polymer 1 (100) | PAG 1 (12) | Quencher 1 (2.0) | PGMEA (2,500) | 120 | 35.3 | 80 | 6.6 |
| Example 2-2 | Polymer 2 (100) | PAG 1 (12) | Quencher 1 (2.0) | PGMEA (2,500) | 120 | 38.1 | 80 | 6.8 |
| Example 2-3 | Polymer 3 (100) | PAG 1 (12) | Quencher 1 (2.0) | PGMEA (2,500) | 120 | 39.6 | 85 | 6.9 |
| Example 2-4 | Polymer 1 (60) Polymer 3 (40) | PAG 1 (12) | Quencher 1 (2.0) | PGMEA (2,500) | 120 | 37.8 | 80 | 6.7 |
| Example 2-5 | Polymer 4 (100) | — | Quencher 1 (2.0) | PGMEA (1,000) CyH (1,500) | 80 | 29.6 | 75 | 5.1 |
| Example 2-6 | Polymer 5 (100) | — | Quencher 1 (2.0) | PGMEA (1,000) CyH (1,500) | 80 | 31.2 | 75 | 5.2 |

TABLE 1-continued

|  | Polymer (pbw) | Acid generator (pbw) | Basic compound (pbw) | Organic solvent (pbw) | PEB temp. (° C.) | Sensitivity ($\mu C/cm^2$) | Resolution (nm) | LER (nm) |
|---|---|---|---|---|---|---|---|---|
| Example 2-7 | Polymer 6 (100) | — | Quencher 1 (2.0) | PGMEA (1,000) CyH (1,500) | 80 | 32.1 | 75 | 5.2 |
| Example 2-8 | Polymer 7 (100) | — | Quencher 1 (2.0) | PGMEA (1,000) CyH (1,500) | 80 | 33.2 | 75 | 5.1 |
| Example 2-9 | Polymer 1 (50) Polymer 4 (50) | PAG 1 (5) | Quencher 1 (2.0) | PGMEA (1,000) CyH (1,500) | 85 | 36.2 | 75 | 5.8 |
| Comparative Example 2-1 | Comparative Polymer 1 (100) | PAG 1 (12) | Quencher 1 (2.0) | PGMEA (1,700) | 110 | 40.0 | 90 | 8.1 |

It is evident from Table 1 that the resist composition comprising the inventive polymer exhibits a satisfactory resolution and sensitivity as well as low LER.

Japanese Patent Application Nos. 2016-114571 and 2017-040213 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer consisting essentially of recurring units having the formula (a), recurring units having the formula (b), recurring units having the formula (c), and optionally recurring units (d) having an adhesive group selected from among lactone ring and cyano groups, and recurring units of at least one type selected from recurring units having the formulae (f1) to (f3), the polymer having a weight average molecular weight of 1,000 to 500,000,

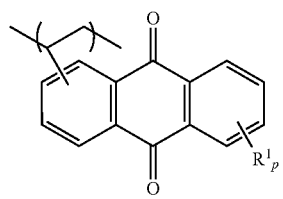
(a)

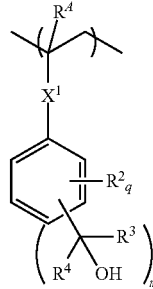
(b)

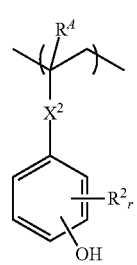
(c)

wherein $R^A$ is each independently hydrogen or methyl, $R^1$ is hydroxyl, $C_1$-$C_4$ straight or branched alkyl, $C_1$-$C_4$ straight or branched alkoxy, acetoxy, or halogen, $R^2$ and $R^5$ are each independently $C_1$-$C_4$ straight or branched alkyl or halogen, $R^3$ and $R^4$ are each independently $C_1$-$C_6$ straight, branched or cyclic alkyl, $R^3$ and $R^4$ may bond together to form a ring with the carbon atom to which they are attached, $X^1$ and $X^2$ are each independently a single bond or ester group, m is 1 or 2, p and q each are 0 or 1, and r is an integer of 0 to 4,

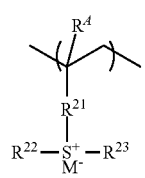
(f1)

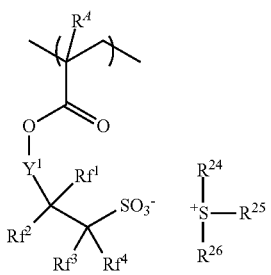
(f2)

-continued (f3)

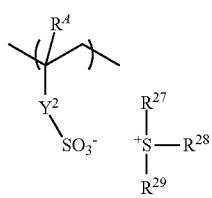

wherein $R^A$ is each independently hydrogen or methyl, $R^{21}$ is a single bond, phenylene group, —O—$R^{31}$-, or —C(=O)—$Z^1$—$R^{31}$—, $Z^1$ is —O— or —NH—, $R^{31}$ is a $C_1$-$C_6$ straight, branched or cyclic alkylene group, $C_2$-$C_6$ straight, branched or cyclic alkenylene group, or phenylene group, which may contain a carbonyl, ester, ether or hydroxyl moiety, $Rf^1$ to $Rf^4$ are each independently fluorine, hydrogen or trifluoromethyl, at least one of $Rf^1$ to $Rf^4$ being fluorine, $R^{22}$ to $R^{29}$ are each independently a $C_1$-$C_{12}$ straight, branched or cyclic alkyl group which may contain a carbonyl, ester or ether moiety, $C_6$-$C_{12}$ aryl group, $C_7$-$C_{20}$ aralkyl group, or mercaptophenyl group, $Y^1$ is a single bond or a $C_1$-$C_{12}$ linking group which may contain an ester, ether moiety or lactone ring, $Y^2$ is a single bond, methylene, ethylene, phenylene, fluorinated phenylene, —O—$R^{32}$—, or —C(=O)—$Z^2$—$R^{32}$—, $Z^2$ is —O— or —NH—, $R^{32}$ is a $C_1$-$C_6$ straight, branched or cyclic alkylene group, $C_2$-$C_6$ straight, branched or cyclic alkenylene group, or phenylene group, which may contain a carbonyl, ester, ether or hydroxyl moiety, and $M^-$ is a non-nucleophilic counter ion.

2. The polymer of claim 1 wherein $R^1$ is $C_1$-$C_4$ straight or branched alkyl, $C_1$-$C_4$ straight or branched alkoxy, acetoxy, or halogen.

3. A negative resist composition comprising a base resin comprising the polymer of claim 1, and an acid generator.

4. The negative resist composition of claim 3, further comprising an organic solvent, the composition being a chemically amplified resist composition.

5. The negative resist composition of claim 3, further comprising a basic compound.

6. The negative resist composition of claim 3, further comprising a surfactant.

7. A photomask blank coated with the negative resist composition of claim 3.

8. A pattern forming process comprising the steps of coating the negative resist composition of claim 3 onto a substrate, baking to form a resist film, exposing the resist film to high-energy radiation, and developing the exposed resist film in a developer.

9. The process of claim 8 wherein the substrate is a photomask blank.

10. The process of claim 8 wherein the high-energy radiation is UV having a wavelength of 180 to 400 nm.

11. The process of claim 8 wherein the high-energy radiation is EB or EUV having a wavelength of 3 to 15 nm.

12. A negative resist composition comprising a base resin consisting essentially of recurring units having the formula (a), recurring units having the formula (b), recurring units having the formula (c), recurring units of at least one type selected from recurring units having the formulae (f1) to (f3), and optionally recurring units (d) having an adhesive group selected from among lactone ring and cyano groups, the polymer having a weight average molecular weight of 1,000 to 500,000, (a)

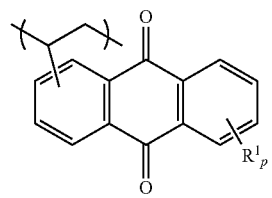

(b)

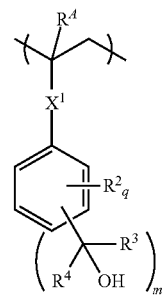

(c)

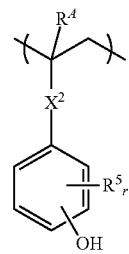

wherein $R^A$ is each independently hydrogen or methyl, $R^1$ is hydroxyl, $C_1$-$C_4$ straight or branched alkyl, $C_1$-$C_4$ straight or branched alkoxy, acetoxy, or halogen, $R^2$ and $R^5$ are each independently $C_1$-$C_4$ straight or branched alkyl or halogen, $R^3$ and $R^4$ are each independently $C_1$-$C_6$ straight, branched or cyclic alkyl, $R^3$ and $R^4$ may bond together to form a ring with the carbon atom to which they are attached, $X^1$ and $X^2$ are each independently a single bond or ester group, m is 1 or 2, p and q each are 0 or 1, and r is an integer of 0 to 4, (f1)

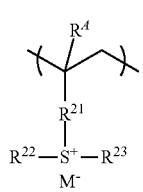

(f2)

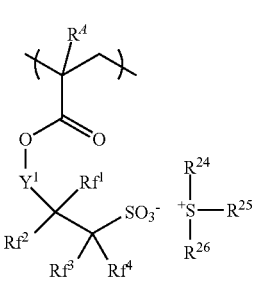

-continued

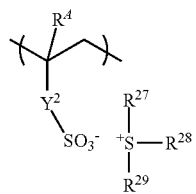

(f3)

wherein $R^4$ is each independently hydrogen or methyl, $R^{21}$ is a single bond, phenylene group, —O—$R^{31}$—, or —C(=O)—$Z^1$—$R^{31}$—, $Z^1$ is —O— or —NH—, $R^{31}$ is a $C_1$-$C_6$ straight, branched or cyclic alkylene group, $C_2$-$C_6$ straight, branched or cyclic alkenylene group, or phenylene group, which may contain a carbonyl, ester, ether or hydroxyl moiety, $Rf^1$ to $Rf^4$ are each independently fluorine, hydrogen or trifluoromethyl, at least one of $Rf^1$ to $Rf^4$ being fluorine, $R^{22}$ to $R^{29}$ are each independently a $C_1$-$C_{12}$ straight, branched or cyclic alkyl group which may contain a carbonyl, ester or ether moiety, $C_6$-$C_{12}$ aryl group, $C_7$-$C_{20}$ aralkyl group, or mercaptophenyl group, $Y^1$ is a single bond or a $C_1$-$C_{12}$ linking group which may contain an ester, ether moiety or lactone ring, $Y^2$ is a single bond, methylene, ethylene, phenylene, fluorinated phenylene, —O—$R^{32}$—, or —C(=O)—$Z^2$—$R^{32}$—, $Z^2$ is —O— or —NH—, $R^{32}$ is a $C_1$-$C_6$ straight, branched or cyclic alkylene group, $C_2$-$C_6$ straight, branched or cyclic alkenylene group, or phenylene group, which may contain a carbonyl, ester, ether or hydroxyl moiety, and $M^-$ is a non-nucleophilic counter ion.

13. The negative resist composition of claim 12 wherein $R^1$ is $C_1$-$C_4$ straight or branched alkyl, $C_1$-$C_4$ straight or branched alkoxy, acetoxy, or halogen.

14. The negative resist composition of claim 12, further comprising an organic solvent, the composition being a chemically amplified resist composition.

15. The negative resist composition of claim 12, further comprising a basic compound.

16. The negative resist composition of claim 12, further comprising a surfactant.

17. A photomask blank coated with the negative resist composition of claim 12.

18. A pattern forming process comprising the steps of coating the negative resist composition of claim 12 onto a substrate, baking to form a resist film, exposing the resist film to high-energy radiation, and developing the exposed resist film in a developer.

19. The process of claim 18 wherein the substrate is a photomask blank.

* * * * *